US008559705B2

(12) United States Patent
Ng

(10) Patent No.: US 8,559,705 B2
(45) Date of Patent: Oct. 15, 2013

(54) INTERACTIVE REFOCUSING OF ELECTRONIC IMAGES

(75) Inventor: Yi-Ren Ng, Mountain View, CA (US)

(73) Assignee: Lytro, Inc., Mountain View, CA (US)

( * ) Notice: Subject to any disclaimer, the term of this patent is extended or adjusted under 35 U.S.C. 154(b) by 1376 days.

(21) Appl. No.: 11/948,901

(22) Filed: Nov. 30, 2007

(65) Prior Publication Data

US 2008/0131019 A1    Jun. 5, 2008

Related U.S. Application Data

(60) Provisional application No. 60/872,089, filed on Dec. 1, 2006.

(51) Int. Cl.
| | | |
|---|---|---|
| *G06K 9/00* | (2006.01) | |
| *G06K 9/46* | (2006.01) | |
| *G06K 9/66* | (2006.01) | |
| *G06K 9/36* | (2006.01) | |
| *G06K 9/54* | (2006.01) | |
| *G06K 9/60* | (2006.01) | |
| *H04N 7/18* | (2006.01) | |
| *G09B 9/00* | (2006.01) | |
| *H04N 5/225* | (2006.01) | |
| *H04N 9/04* | (2006.01) | |
| *H04N 9/74* | (2006.01) | |
| *G06F 3/033* | (2013.01) | |
| *G09G 5/08* | (2006.01) | |
| *G06T 15/00* | (2011.01) | |
| *G09G 5/00* | (2006.01) | |

(52) U.S. Cl.
USPC ........... 382/162; 382/190; 382/255; 382/282; 382/305; 348/121; 348/207.99; 348/218.1; 348/345; 345/157; 345/419; 345/581

(58) Field of Classification Search
USPC ......... 382/100, 103, 153–154, 162, 173, 181, 382/190, 254–255, 276, 282, 293, 295–296, 382/305–307; 348/61, 63, 121, 135, 143, 348/159, 207.99; 345/418–419, 427, 629, 345/633–634, 646, 649–650, 655–659
See application file for complete search history.

(56) References Cited

U.S. PATENT DOCUMENTS

| | | |
|---|---|---|
| 725,567 A | 4/1903 | Ives |
| 4,383,170 A | 5/1983 | Takagi et al. |

(Continued)

FOREIGN PATENT DOCUMENTS

| | | |
|---|---|---|
| DE | 19624421 | 6/1996 |
| WO | WO 03/052465 | 6/2003 |

(Continued)

OTHER PUBLICATIONS

Agarwala, A., et al., "Interactive Digital Photomontage," ACM Transactions on Graphics, Proceedings of SIGGRAPH 2004, vol. 32, No. 3, 2004.

(Continued)

*Primary Examiner* — Randolph I Chu
*Assistant Examiner* — Nathan Bloom
(74) *Attorney, Agent, or Firm* — Raubvogel Law Office

(57) ABSTRACT

A method is performed to refocus a digital photographic image comprising a plurality of pixels. In the method, a set of images is computed corresponding to the digital photographic image and focused at different depths. Refocus depths for at least a subset of the pixels are identified and stored in a look-up table. At least a portion of the digital photographic image is refocused at a desired refocus depth determined from the look-up table.

16 Claims, 16 Drawing Sheets

(56) References Cited

U.S. PATENT DOCUMENTS

| | | | |
|---|---|---|---|
| 4,661,986 A | | 4/1987 | Adelson |
| 4,694,185 A | | 9/1987 | Weiss |
| 4,920,419 A | | 4/1990 | Easterly |
| 5,076,687 A | | 12/1991 | Adelson |
| 5,282,045 A | | 1/1994 | Mimura et al. |
| 5,610,390 A | | 3/1997 | Miyano |
| 5,748,371 A | | 5/1998 | Cathey, Jr. et al. |
| 5,757,423 A | | 5/1998 | Tanaka et al. |
| 5,949,433 A | * | 9/1999 | Klotz ........................... 345/634 |
| 6,023,523 A | | 2/2000 | Cohen et al. |
| 6,028,606 A | | 2/2000 | Kolb et al. |
| 6,091,860 A | * | 7/2000 | Dimitri ........................ 382/299 |
| 6,097,394 A | | 8/2000 | Levoy et al. |
| 6,201,899 B1 | | 3/2001 | Bergen |
| 6,320,979 B1 | | 11/2001 | Melen |
| 6,466,207 B1 | * | 10/2002 | Gortler et al. ................ 345/427 |
| 6,483,535 B1 | | 11/2002 | Tamburrino et al. |
| 6,577,342 B1 | | 6/2003 | Wester |
| 6,597,859 B1 | | 7/2003 | Leinhardt et al. |
| 6,606,099 B2 | * | 8/2003 | Yamada ....................... 345/690 |
| 6,842,297 B2 | | 1/2005 | Dowski, Jr. et al. |
| 6,900,841 B1 | | 5/2005 | Mihara |
| 6,927,922 B2 | | 8/2005 | George et al. |
| 7,034,866 B1 | | 4/2006 | Colmenarez et al. |
| 7,079,698 B2 | * | 7/2006 | Kobayashi .................... 382/250 |
| 7,336,430 B2 | | 2/2008 | George et al. |
| 7,620,309 B2 | | 11/2009 | Georgiev |
| 7,623,726 B1 | | 11/2009 | Georgiev |
| 7,949,252 B1 | | 5/2011 | Georgiev |
| 8,155,478 B2 | | 4/2012 | Vitsnudel et al. |
| 2002/0015048 A1 | * | 2/2002 | Nister .......................... 345/625 |
| 2002/0159030 A1 | | 10/2002 | Frey et al. |
| 2003/0103670 A1 | * | 6/2003 | Schoelkopf et al. .......... 382/162 |
| 2003/0117511 A1 | | 6/2003 | Belz et al. |
| 2003/0156077 A1 | | 8/2003 | Balogh |
| 2004/0114176 A1 | * | 6/2004 | Bodin et al. .................. 358/1.15 |
| 2004/0135780 A1 | * | 7/2004 | Nims ............................ 345/419 |
| 2005/0031203 A1 | * | 2/2005 | Fukuda ......................... 382/176 |
| 2005/0080602 A1 | | 4/2005 | Snyder et al. |
| 2006/0130017 A1 | | 6/2006 | Cohen et al. |
| 2007/0008317 A1 | * | 1/2007 | Lundstrom .................... 345/424 |
| 2007/0071316 A1 | * | 3/2007 | Kubo ............................ 382/162 |
| 2007/0188613 A1 | * | 8/2007 | Nobori et al. ............... 348/207.1 |
| 2007/0252074 A1 | | 11/2007 | Ng et al. ..................... 250/208.1 |
| 2007/0269108 A1 | * | 11/2007 | Steinberg et al. ............. 382/173 |
| 2008/0007626 A1 | | 1/2008 | Wernersson |
| 2008/0018668 A1 | * | 1/2008 | Yamauchi ..................... 345/633 |
| 2008/0131019 A1 | | 6/2008 | Ng |
| 2008/0144952 A1 | * | 6/2008 | Chen et al. .................... 382/239 |
| 2008/0152215 A1 | | 6/2008 | Horie et al. |
| 2008/0180792 A1 | | 7/2008 | Georgiev |
| 2008/0187305 A1 | | 8/2008 | Raskar et al. |
| 2008/0193026 A1 | | 8/2008 | Horie et al. |
| 2008/0226274 A1 | | 9/2008 | Spielberg |
| 2008/0266655 A1 | | 10/2008 | Levoy et al. |
| 2008/0309813 A1 | | 12/2008 | Watanabe |
| 2009/0027542 A1 | | 1/2009 | Yamamoto et al. |
| 2009/0041381 A1 | | 2/2009 | Georgiev et al. |
| 2009/0041448 A1 | | 2/2009 | Georgiev et al. |
| 2009/0102956 A1 | | 4/2009 | Georgiev |
| 2009/0128658 A1 | | 5/2009 | Hayasaka et al. |
| 2009/0128669 A1 | | 5/2009 | Ng et al. |
| 2009/0140131 A1 | | 6/2009 | Utagawa |
| 2009/0185801 A1 | | 7/2009 | Georgiev et al. |
| 2009/0268970 A1 | | 10/2009 | Babacan et al. |
| 2009/0273843 A1 | | 11/2009 | Raskar et al. |
| 2009/0295829 A1 | | 12/2009 | Georgiev et al. |
| 2010/0026852 A1 | | 2/2010 | Ng et al. |
| 2010/0277629 A1 | | 11/2010 | Tanaka |

FOREIGN PATENT DOCUMENTS

| | | |
|---|---|---|
| WO | WO 2006/039486 A2 | 4/2006 |
| WO | WO 2007/092545 A2 | 8/2007 |
| WO | WO 2007/092581 A2 | 8/2007 |

OTHER PUBLICATIONS

Georgeiv, T., et al., "Spatio-Angular Resolution Tradeoff in Integral Photography," Proceedings of Eurographics Symposium on Rendering, 2006.

Isaksen, A., et al., "Dynamically Reparameterized Light Fields," SIGGRAPH 2000, pp. 297-306.

Levoy, M., et al., "Light Field Microscopy," ACM Transactions on Graphics, vol. 25, No. 3, Proceedings SIGGRAPH 2006.

Ng, R., "Digital Light Field Photography," Dissertation, Department of Computer Science, Stanford University, Jun. 2006.

Ng, R., et al. "Light Field Photography with a Hand-held Plenoptic Camera," Stanford Technical Report, CSTR 2005-2, 2005.

Ng., R., "Fourier Slice Photography," ACM Transactions on Graphics, Proceedings of SIGGRAPH 2005, vol. 24, No. 3, 2005, pp. 735-744.

Vaish, V., et al., "Synthetic Aperture Focusing Using a Shear-Warp Factorization of the Viewing Transform," Workshop on Advanced 3D Imaging for Safety and Security (in conjunction with CVPR 2005), 2005.

Herbert E. Ives, "Optical properties of a Lippman lenticulated sheet," J. Opt. Soc. Am. 21, 171 (1931).

Vaish et al., "Using plane + parallax for calibrating dense camera arrays", In Proceedings CVPR 2004, pp. 2-9.

Wilburn et al., "High Performance Imaging using Large Camera Arrays", ACM Transactions on Graphics (TOG), vol. 24, Issue 3 (Jul. 2005), Proceedings of ACM SIGGRAPH 2005, pp. 765-776.

Jin-Xiang Chai et al., "Plenoptic Sampling", ACM SIGGRAPH 2000, Annual Conference Series, 2000, pp. 307-318.

Jackson et al., "Selection of a Convolution Function for Fourier Inversion Using Gridding" IEEE Transactions on Medical Imaging, Sep. 1991, vol. 10, No. 3, pp. 473-478.

Naemura et al., "3-D Computer Graphics based on Integral Photography" Optics Express, Feb. 12, 2001. vol. 8, No. 2, pp. 255-262.

Okano et al., "Three-dimensional video system based on integral photography" Optical Engineering, Jun. 1999. vol. 38, No. 6, pp. 1072-1077.

Adelson et al., "Single Lens Stereo with a Plenoptic Camera" IEEE Translation on Pattern Analysis and Machine Intelligence, Feb. 1992. vol. 14, No. 2, pp. 99-106.

Levoy et al., "Light Field Rendering" SIGGRAPH 96 Proceeding, 1996. pp. 31-42.

Haeberli, "A Multifocus Method for Controlling Depth of Field" GRAPHICA Obscura, 1994, pp. 1-3.

Lumsdaine et al., "Full Resolution Lightfield Rendering" Adobe Technical Report Jan. 2008, pp. 1-12.

Levoy, "Light Fields and Computational Imaging" IEEE Computer Society, Aug. 2006, pp. 46-55.

Lippmann, "Reversible Prints", Communication at the French Society of Physics, Journal of Physics, 7, 4, Mar. 1908, pp. 821-825.

Sokolov, "Autostereoscopy and Integral Photography by Professor Lippmann's Method", 1911, pp. 23-29.

Adelson, E. H., and Bergen, J. R. 1991. The plenoptic function and the elements of early vision. In Computational Models of Visual Processing, edited by Michael S. Landy and J. Anthony Movshon. Cambridge, Mass.: mit Press.

Adobe, "Photoshop CS6 / in depth: Digital Negative (DNG)", http://www.adobe.com/products/photoshop/extend.displayTab2html. Retrieved Jan. 2013.

Georgiev, T., et al., Plenoptic Camera 2.0 (2008).

Mallat, Stephane, "A Wavelet Tour of Signal Processing", Academic Press 1998.

Nakamura, J., "Image Sensors and Signal Processing for Digital Still Cameras" (Optical Science and Engineering), 2005.

(56) References Cited

OTHER PUBLICATIONS

Ogden, J., "Pyramid-Based Computer Graphics", 1985.
Story, D., "The Future of Photography", Optics Electronics, Oct. 2008.
Portable Network Graphics format: http://en.wikipedia.org/wiki/Portable_Network_Graphics. Retrieved Jan. 2013.
Exchangeable image file format: http://en.wikipedia.org/wiki/Exchangeable_image_file_format. Retrieved Jan. 2013.
Extensible Metadata Platform: http://en.wikipedia.org/wiki/Extensible_Metadata_Platform. Retrieved Jan. 2013.
Compression standard JPEG XR: http://en.wikipedia.org/wiki/JPEG_XR. Retrieved Jan. 2013.
Methods of Variable Bitrate Encoding (http://en.wikipedia.org/wiki/Variable_bitrate#Methods_of_VBR_encoding). Retrieved Jan. 2013.
Lazy loading of image data (http://en.wikipedia.org/wiki/Lazy_loading). Retrieved Jan. 2013.
Key framing for video animation (http://en.wikipedia.org/wiki/Key_frame). Retrieved Jan. 2013.
Data overlay techniques for real-time visual feed. For example, heads-up displays (http://en.wikipedia.org/wiki/Head-up_display). Retrieved Jan. 2013.
Autofocus systems and methods (http://en.wikipedia.org/wiki/Autofocus). Retrieved Jan. 2013.
Williams, L., "Pyramidal Parametrics", Computer Graphics (1983).

* cited by examiner

User chooses wide brush for decreasing focal depth and paints at position 1308.

User chooses narrower brush for increasing focal depth and paints at position 1312.

INTERACTIVE REFOCUSING OF ELECTRONIC IMAGES

RELATED APPLICATIONS

This application claims priority to U.S. Provisional Patent Application No. 60/872,089, titled "Method and System for Interactive Refocusing of Electronic Images," filed Dec. 1, 2006, which is incorporated by reference herein in its entirety.

This application is related to the following applications: (1) U.S. patent application Ser. No. 11/576,438, titled "Imaging Arrangements and Methods Therefor," filed Mar. 30, 2007; (2) U.S. Provisional Patent Application No. 60/615,179, titled "An Integrated Light Field Camera System for Enhanced Digital Photography," filed Oct. 1, 2004; (3) U.S. Provisional Patent Application No. 60/647,492, titled "Enhanced Photographic Imaging with a Light Field Camera," filed Jan. 27, 2005; (4) U.S. Provisional Patent Application No. 60/765,903, titled "Imaging Arrangements and Methods Therefor," filed Feb. 7, 2006; (5) U.S. Provisional Patent Application No. 60/810,432, titled "Digital Light Field Photography," filed Jun. 2, 2006; (6) PCT Application No. PCT/US2005/035189, titled "Imaging Arrangements and Methods Therefor," filed Jan. 27, 2005; (7) PCT Application No. PCT/US2007/003346, titled "Variable Imaging Arrangements and Methods Therefor," filed Feb. 7, 2007; and (8) PCT Application No. PCT/US2007/003420, titled "Correction of Optical Aberrations," filed Feb. 7, 2007. All of these applications are incorporated by reference herein in their entirety.

TECHNICAL FIELD

The disclosed embodiments relate generally to imaging applications, and more specifically to interactive modifications of the appearance of focus in images.

BACKGROUND

Images viewed on electronic displays, such as on web pages, digital photo albums, and image editing programs, typically do not allow the optical focus of the image to be altered interactively. Changing the optical focus would allow different parts of the image to be enhanced for a variety of purposes, such as improving clarity, visibility, or legibility; redirecting the gaze of the viewer to a new center of interest; interactively exploring the visual scene to discover items that would otherwise be blurred out; entertainment; and more.

SUMMARY

In an aspect of the present invention, a method is performed to refocus a digital photographic image comprising a plurality of pixels. In the method, a set of images is computed corresponding to a scene in the digital photographic image. Each image comprises an image of the scene at a distinct focal depth. Refocus depths for at least a subset of the pixels are identified and stored in a look-up table. At least a portion of the digital photographic image is refocused at a desired refocus depth determined from the look-up table.

In another aspect, a set of digital photographic images is compiled. Each image comprises an image of a scene at a distinct focal depth. Refocus depths for regions within the scene are identified and stored in a look-up table. At least a portion of an image from the set is refocused at a desired refocus depth determined from the look-up table.

In yet another aspect, a method of refocusing a digital photographic image includes displaying the image at a first focal depth and displaying an icon to select a position in the image. Input is interactively received to modify the image by refocusing at least a portion of the image to a second focal depth corresponding to the selected position. In response to the received input, the modified image is displayed.

In yet another aspect, a method of refocusing a digital photographic image includes displaying the image at a first focal depth and displaying a slider icon. The slider icon has a first position corresponding to the first focal depth. Input is interactively received to move the slider icon to a second position corresponding to a second focal depth. In response to the received input, the image is refocused at the second focal depth.

BRIEF DESCRIPTION OF THE DRAWINGS

Like reference numerals refer to corresponding parts throughout the drawings.

DESCRIPTION OF EMBODIMENTS

Reference will now be made in detail to embodiments, examples of which are illustrated in the accompanying drawings. In the following detailed description, numerous specific details are set forth in order to provide a thorough understanding of the present invention. However, it will be apparent to one of ordinary skill in the art that the present invention may be practiced without these specific details. In other instances, well-known methods, procedures, components, and circuits have not been described in detail so as not to unnecessarily obscure aspects of the embodiments.

A method and system for conveniently storing, editing and interacting with electronic image data that provides user-control over the focus of the image is presented in accordance with some embodiments. Exemplary features and their advantages are disclosed in the following sections.

In some embodiments, a plenoptic/light field camera system is used to capture raw 4D light field data of a scene, as described in Ng, R., et al., "Light Field Photography with A Hand-Held Plenoptic Camera," Stanford Tech Report CSTR-2005-02, which is hereby incorporated by reference in its entirety.

Figure 1:
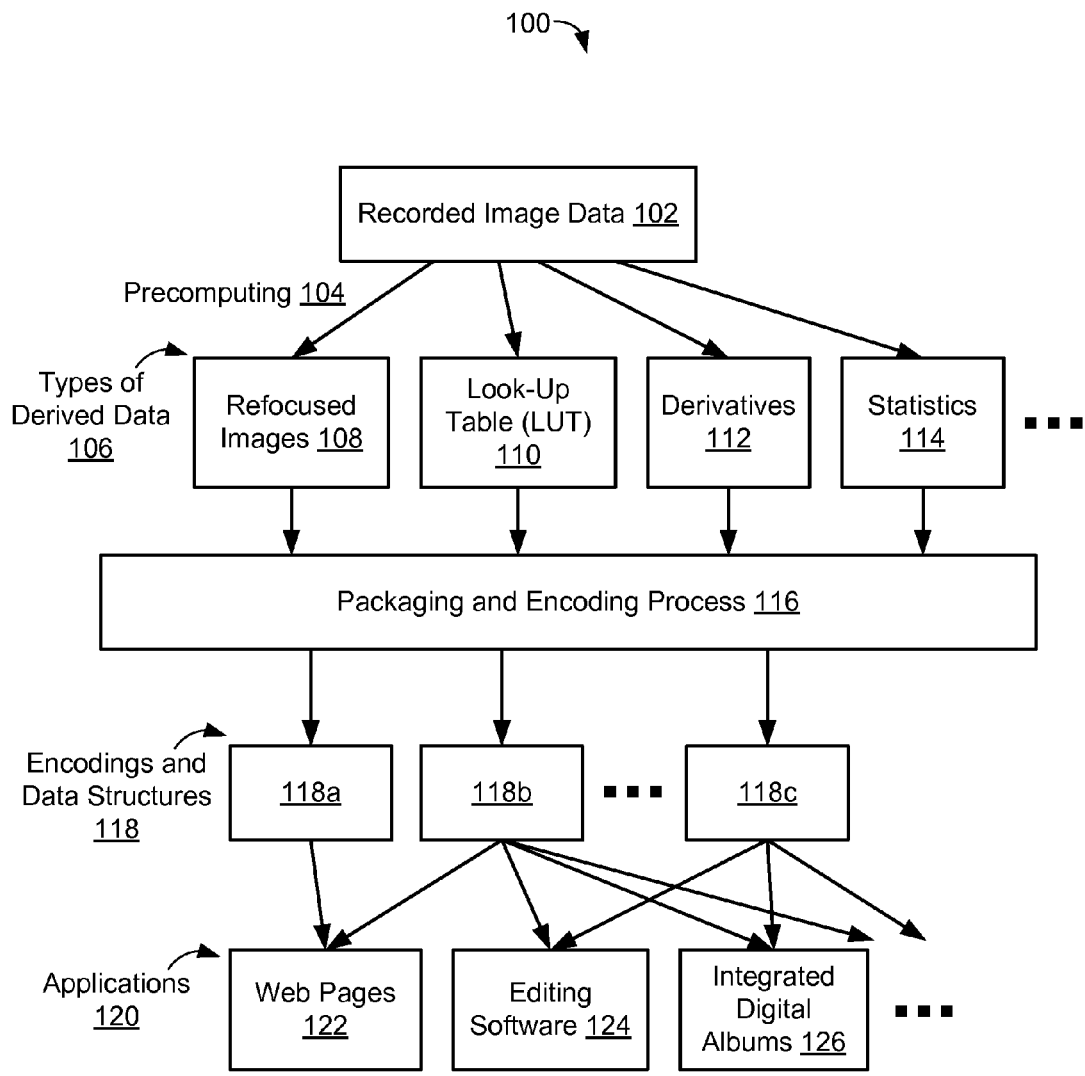
FIG. 1 is a flow diagram illustrating a system for pre-processing, storing, and interacting with recorded light field image data in accordance with some embodiments.

FIG. 1 is a flow diagram illustrating a system and/or method 100 for pre-processing and storing these data and for providing interfaces for a user to interactively alter the focus of an image of the scene in a variety of applications in accordance with some embodiments. Precomputing operations 104 performed on recorded image data 102 produce multiple types of derived data 106, including but not limited to refocused images 108, a look-up table (LUT) 110, derivatives 112, and statistics 114. The derived data 106 is provided to a packaging and encoding process 116, which produces multiple encodings and data structures 118. The encodings and data structures 118 are provided to applications 120, such as web pages 122, editing software 124, and integrated digital albums 126.

Pre-Processing

Computing a Set of Refocused Images

Figure 2:
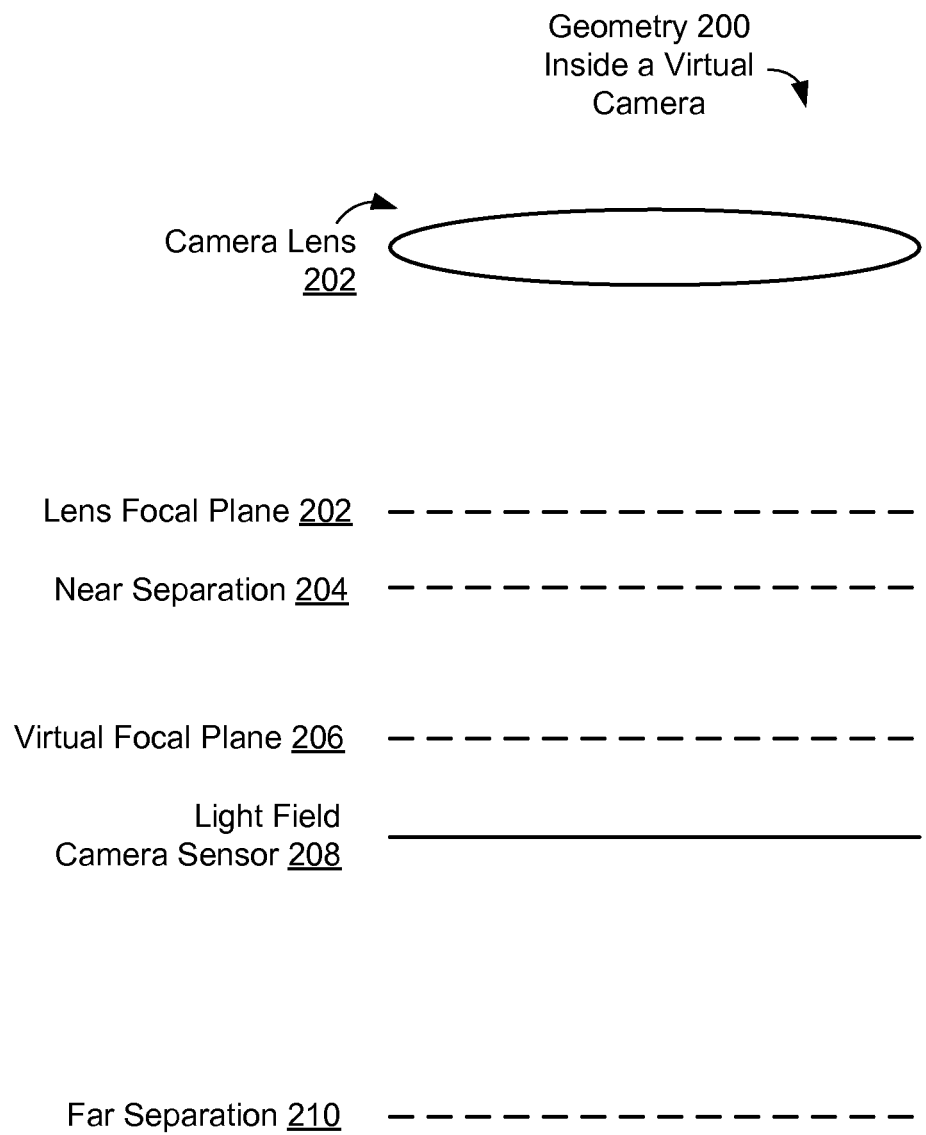
FIG. 2 is a schematic diagram of the geometry inside a virtual camera in accordance with some embodiments.

The pre-processing involves computing a set of images focused at different depths, spanning a range of depths that encompasses various subjects of interest. Two aspects of such a computation are: (1) how to automatically choose the closest and furthest distances to refocus, and (2) how to choose the change in depth between each frame. These furthest and closest distances in world focal depth (i.e., the depth of focus in the actual scene being imaged) are related to near 204 and far 206 separations between the virtual focal plane 206 typically used in synthetic aperture imaging methods to compute images refocused at different depths, as illustrated in FIG. 2 in accordance with some embodiments.

In one embodiment, the closest and furthest distances are chosen to be the range over which the camera can be focused sharply—that is the range of depths equal to an extended depth of focus N times larger than the natural depth of focus of the camera optics. The advantage of this approach is that each refocused image appears roughly as sharply as it would have been imaged by a conventional camera that was optically focused at that depth.

In other embodiments, this effective depth of focus may be extended by a linear factor. Selecting a tolerable mis-focus (e.g., in pixels) on the refocus focal plane sets this linear factor, which is a function of the selected mis-focus. In one embodiment, an optimization is utilized to cap the furthest distance at optical infinity. In practice, in digital refocusing this means not simulating virtual refocused cameras where the virtual film plane (i.e., the virtual focal plane 206) is closer to the lens than the focal point of the lens, as shown in FIG. 2. This distance is related to the geometry of the lens, and in some cases cannot be deduced from the raw light field dataset itself. For this reason, in some embodiments the camera system will store the configuration of the camera with the recorded light field data. The configuration of the camera may include the metric separation between the lens 202 and the light field sensor 208, the critical points of the lens, including the focal points and the principal planes, and/or the optical formula of the lens.

Figure 3:
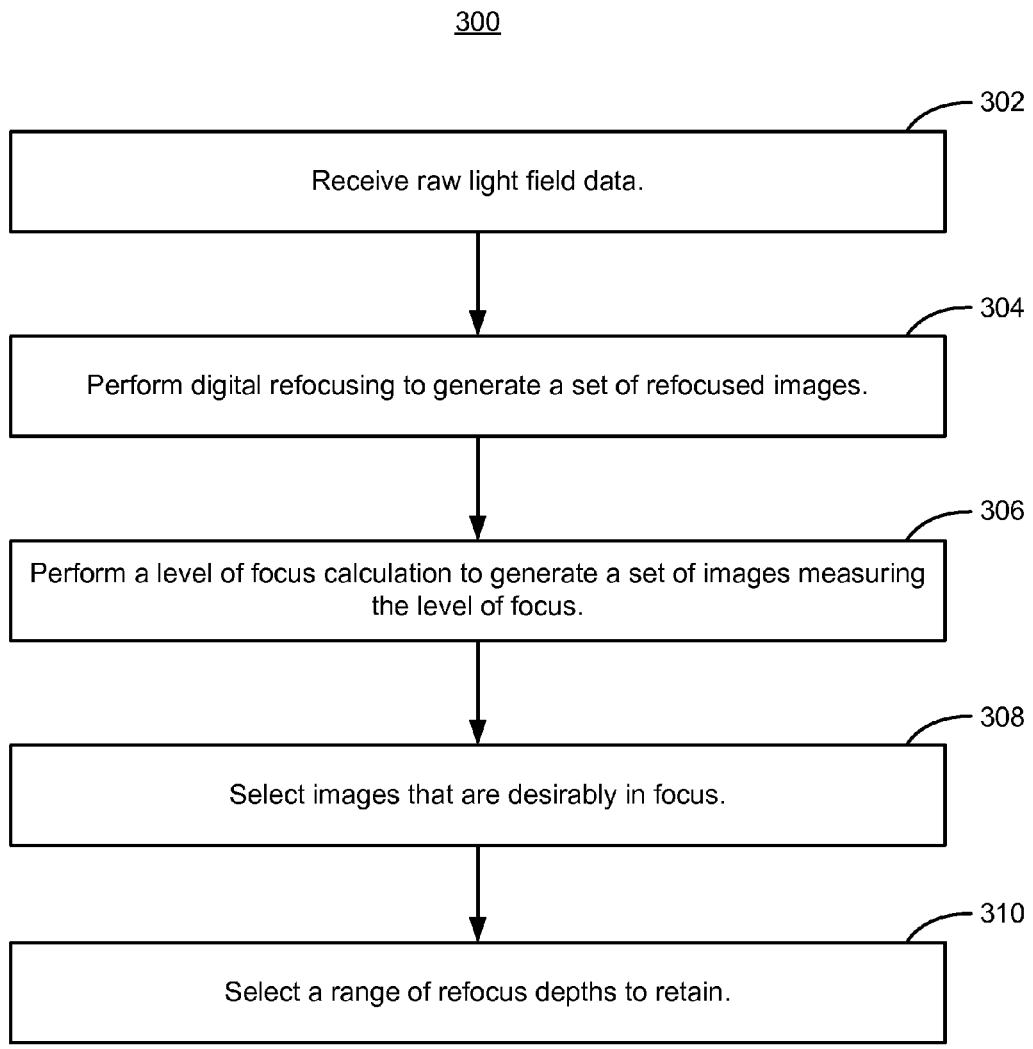
FIG. 3 is a flow diagram illustrating a process for selecting a range of refocus depths to retain in accordance with some embodiments.

In another embodiment, the closest and furthest distances are chosen by their relation to the content of the scene. For example, there is little visual advantage to focusing closer or further than the closest and furthest objects in the scene. These may be deduced by analyzing the recorded light field data. In one exemplary embodiment (FIG. 3), a dense set of images focused at different depths is computed, and a quantitative measure of the amount of visual interest in each image is computed. Specifically, FIG. 3 is a flow diagram illustrating a process 300 for selecting a range of refocus depths to retain in accordance with some embodiments. In the process 300, raw light field data is received (302). Digital refocusing is performed (304) to generate a set of refocused images. A level of focus calculation is performed (306) to generate a set of images measuring the level of focus. In this example, the level of focus represents the amount of visual interest. Images that are desirably in focus are selected (308) and a range of refocus depths to retain is selected (310).

In some embodiments, the measure of visual interest is taken to be the L2 norm of the gradient magnitude of the image. In some cases the gradient magnitude is estimated with standard finite differences over the discrete 2D domain of pixel values.

This has the effect of measuring the density of strong edges in the scene at that refocus depth. Images for which the measure is sufficiently high are marked, and the smallest range of depths that encompasses all marked images defines the closest and furthest distances. In one exemplary embodiment the measure is sufficiently high if it is above a fraction of the highest measure for any image. In another exemplary embodiment, the measure is sufficiently high if it is a multiple above the number of its neighboring images at the closest refocus depths.

Figure 4:
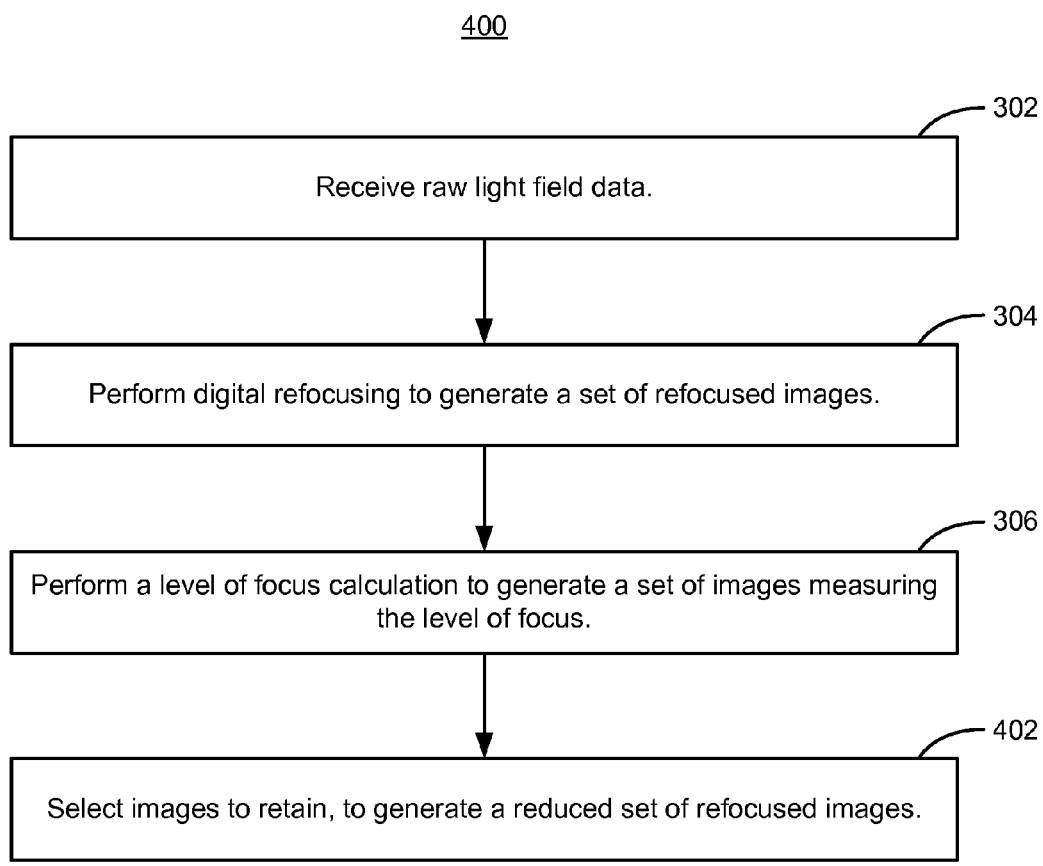
FIG. 4 is a flow diagram illustrating a process for selection of refocused images to retain in accordance with some embodiments.

In another exemplary embodiment, the set of retained images is reduced by removing images with low measure (FIG. 4). As illustrated in FIG. 4 in accordance with some embodiments, operations 302 to 306 are performed as described with regard to process 300 (FIG. 3). Images to retain are selected (402), to generate a reduced set of refocused images. The refocus depth of each image in the retained set is stored with the image in order to enable appropriate interpolation between images during interactive refocusing. In another embodiment, the reduced set of images is augmented with images at depths in between existing images in the set in order to provide some less focused images that will serve to increase continuity when interpolating between images during interactive refocusing.

With regards to the change in depth of the virtual focal plane 206 between frames in the set of computed refocused images, there are two main considerations. The first is the rate of change in depth, which is not linear in world space (i.e., in the actual scene being imaged), and the second is the absolute spacing between depths (or equivalently the number of image frames). In one embodiment, the change in depth between frames in the computed set of images is chosen so that the change of the circle of confusion on the refocus focal plane is proportional to one pixel. This is equivalent to linearly changing the separation between the virtual focal plane and the main lens of the virtual refocused camera in simulating a refocused photograph. This also means varying the depth of the world focal plane in a scale that is linear in diopters, that is proportional to $1/z$, where z is the distance of the world focal plane from the camera. This has the effect of computing more images at world focal depths closer to the camera.

The appropriate absolute spacing between refocus depths depends on the requirements of the application. However, one obtains diminishing returns in changing the focal depth by much less than the distance required to cause a change of one output pixel in the size of the circle of confusion on the focal plane. In an exemplary embodiment, a change of one pixel is created by moving the virtual focal plane by a distance equal to half the depth of focus of a conventional camera. For example, if the light field camera has an f/4 lens, and the size of the microlenses is 125 microns, then creating a one pixel change in output images is equivalent to changing the separation between the virtual image plane and the lens by approximately 500 microns. In general, this is a change of approximately $(N*p)$ microns, where the lens is f/N and the microlenses are p microns across. Such a change is roughly equivalent to choosing an incremental shift of one pixel in each successive refocus frame when utilizing the shift-and-add algorithm for computing refocused frames, as described in Ng, R., Digital Light Field Photography, Stanford University PhD Dissertation, 2006, which is hereby incorporated by reference in its entirety.

Computation of Look-Up-Table

An auxiliary data-structure that is stored with the image data in some embodiments of the present invention is a look-up-table (referred to as a LUT below) of a desired refocus depth for each pixel of the output image. In an exemplary embodiment of the present invention, a typical query of this data-structure involves supplying a 2D position in the output image, and obtaining a desired refocus depth. In another embodiment, a set of depths may be obtained. The ways in which these depths are used is described in greater detail below with respect to the interaction system. However, to summarize here, in many embodiments these depths are used to select an appropriate image in the set of refocused frames for display or further processing.

Figure 5:
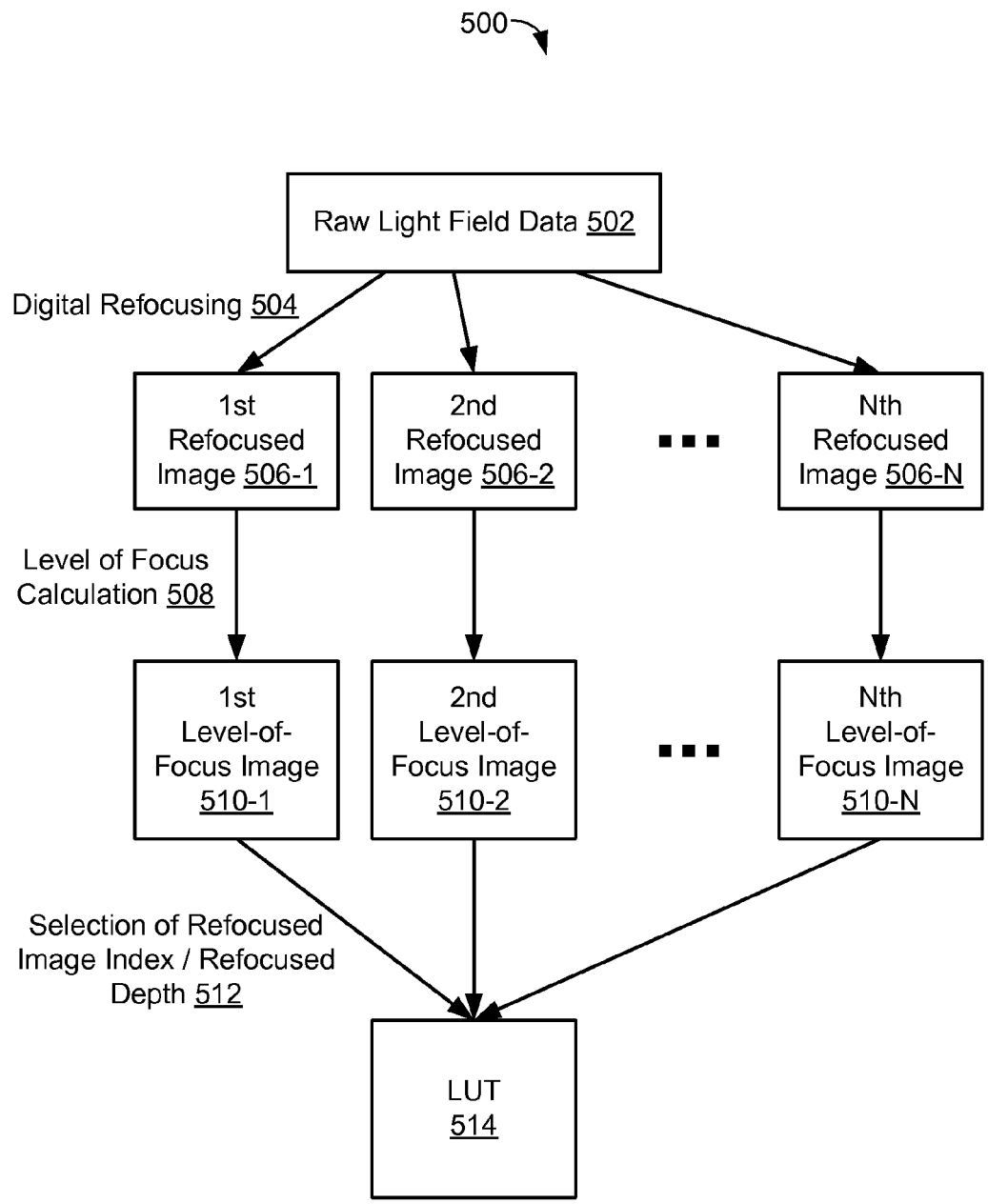
FIG. 5 is a flow diagram illustrating a process for computation of a look-up table (LUT) in accordance with some embodiments.

Such a LUT can be computed in many different ways with different tradeoffs depending on the application. The following specific exemplary embodiment is presented to illustrate some of the main principles. In this embodiment each refocused image is processed to compute the level of focus at each pixel, as illustrated in FIG. 5. FIG. 5 is a flow diagram illustrating a process 500 for computation of a LUT 514 in accordance with some embodiments. Raw light field data 502 is digitally refocused (504) to generate a set of N refocused images 506. A level of focus calculation 508 is performed on the refocused images 506. For example, the level of focus can be estimated by computing the gradient magnitude at every pixel in the image, utilizing standard discrete calculus methods, such as computing finite differences between neighboring pixels. One thus obtains a stack of images 510 where the pixel values are a measure of the level focus in that region. In the next step (512), the index of the image with the highest level of focus is obtained for each pixel. In one exemplary embodiment, the LUT 514 consists of simply a 2D array of these index values. Such a LUT 514 can be stored well simply as an image, compressed using standard image compression techniques.

One of the problems that may occur with this method is that regions of objects in the scene that exhibit little surface texture (high-frequency 2D variation across their surfaces), may not exhibit a high measure of focus in any of the refocused images. For example, the cheeks of a person's face are potentially such a region. In such cases, one may obtain spurious LUT values for pixels associated with these objects.

In another embodiment of the present invention, these regions are detected and their values in the LUT are corrected. One way to identify such trouble regions involves looking at the "pixel statistics", which are the statistics for how the measure of focus varies across the set of refocused images for a fixed pixel location. Each pixel has different statistics across the set of images. By examining the pixel statistics at different image locations, one can obtain a measure of the accuracy of the LUT value. Trouble regions may be characterized by a low maximum measure of focus as compared to other regions of the scene, and by relatively constant color (color of the refocused images, not of the computed measure of focus) across the set of refocused images. For example, in the case of the pixels in the middle of the person's cheeks, the measure of focus may be relatively low at all focal depths, and the refocused pixel color is relatively constant at all focal depths.

These observations lead to a method to fix the value of the trouble pixels. In an exemplary embodiment, identified trouble pixels derive their LUT values from appropriate neighboring pixels. The idea is to search in a region surrounding the trouble pixel, preferring pixels that are connected to the trouble pixel by a path of pixels which have a color similar to the trouble pixel. The process terminates when a neighboring pixel is found in the search region that is not a trouble pixel (i.e. we are relatively confident that its LUT value is valid). The trouble pixel's LUT value is set to the LUT value for this found pixel. For example, for trouble pixels in the middle of a person's cheeks, this search procedure sets the LUT value to the LUT value for the person's eyes, or for the band of pixels on the edge of the person's face.

In some embodiments of the invention, the LUT is downsampled, such that its 2D resolution is lower than that of the underlying refocused images. This may be desired for compactness of the LUT, and/or for concentrating changes in interactive refocusing to track larger features in the scene rather than pixel-to-pixel changes. One exemplary embodiment of the invention utilizes a reduction in resolution such that approximately 20×20 original pixels fall within a downsampled macropixel.

Figure 6:
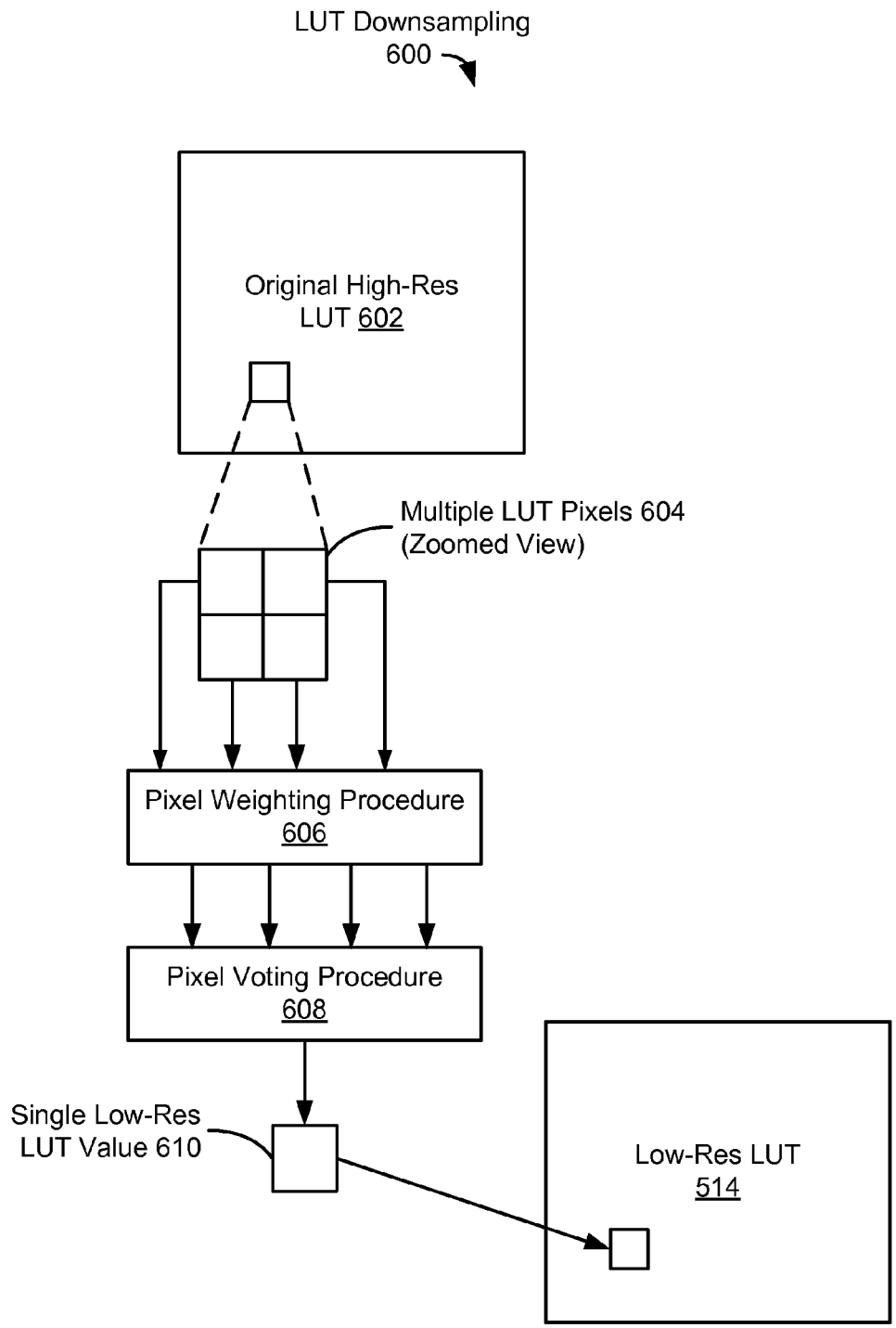
FIG. 6 is a block diagram illustrating a LUT downsampling process in accordance with some embodiments.

Different approaches to downsampling may be used to emphasize different aspects of interactive refocusing. In an exemplary embodiment, the downsampling method is implemented by a voting procedure. Each original LUT pixel that falls within a macroscopic LUT pixel votes for its index value. The index value with the most votes is used as the downsampled LUT's macropixel value. In another exemplary embodiment, the voting procedure is modified to emphasize parts of the downsampled region that contain stronger edges. The vote for each original pixel is weighted (FIG. 6). Suppose the pixel votes for frame N. The weight is the gradient magnitude at the pixel at frame N.

Other weighting functions may be used to emphasize different aspects of the image. In another exemplary embodiment, the weighting is higher for pixels voting for refocus depths closer to the camera. This has the effect of tending to focus on closer subjects, such as people in front of background scenes.

FIG. 6 illustrates a LUT downsampling process 600 in accordance with some embodiments. Values of multiple LUT pixels 604 in an original high-resolution LUT 602 are provided to a pixel weighting procedure 606. The weighted pixel values are provided to a pixel voting procedure 608, resulting in a single low-resolution LUT value 610, which is stored in a low-resolution LUT 514.

In another embodiment, the methods of downsampling and correcting for trouble pixels are combined to obtain a downsampled LUT with corrections.

The above embodiments describe pre-computing a measure of local focus, but the underlying technique of pre-computing data on the focal stack (i.e., the set of images refocused at different depths) is general, and may be used to pre-compute and store other useful partial computations. For example, it may be used to compute the depth of the closest object in the world at every pixel, as described by E. H. Adelson and J. Y. A. Wang, Single Lens Stereo with a Plenoptic Camera, IEEE Transactions on Pattern Analysis and Machine Intelligence, 14(2):99-106, 1992, which is hereby incorporated by reference in its entirety. It may also be used to pre-compute partial derivatives, a measure of the likelihood that a given pixel is part of a face or body, using existing face-detection algorithms, and more.

User Interaction System

Figure 8:
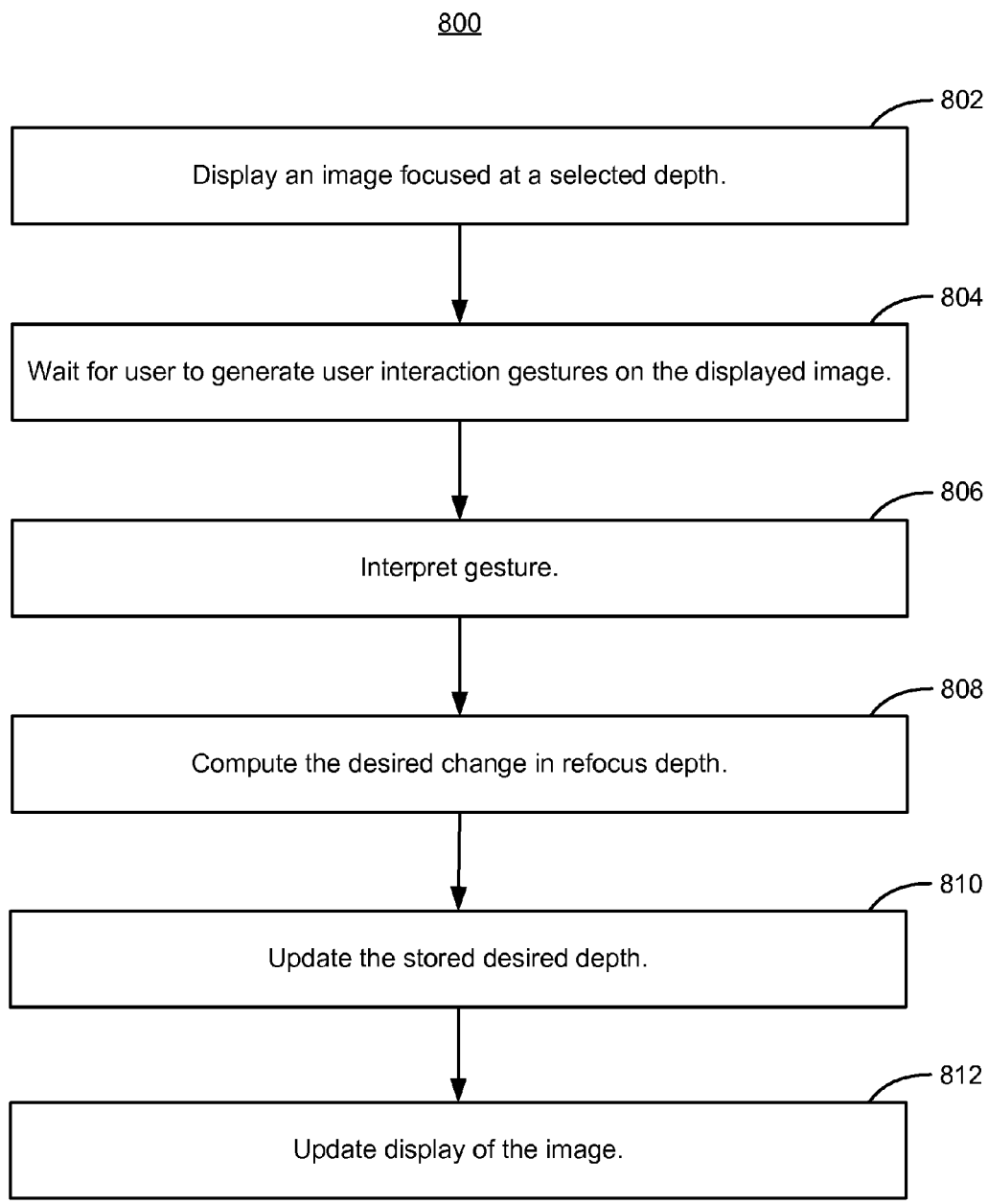
FIG. 8 is a flow diagram illustrating a process for interactive refocusing in accordance with some embodiments.

The present invention enables a user to make gestures to the system in order to interactively modify the focus of the image on an electronic display. FIG. 8 is a flow diagram illustrating a process 800 for interactive refocusing according to an exemplary embodiment of such an interaction system. In the process 800, an image focused at a selected depth is displayed (802). The system waits (804) for the user to generate user interaction gestures on the displayed image. The gesture is interpreted (806) and the desired change in refocus depth is computed (808). The stored desired depth is updated (810) and display of the image is updated (812).

Figure 7:
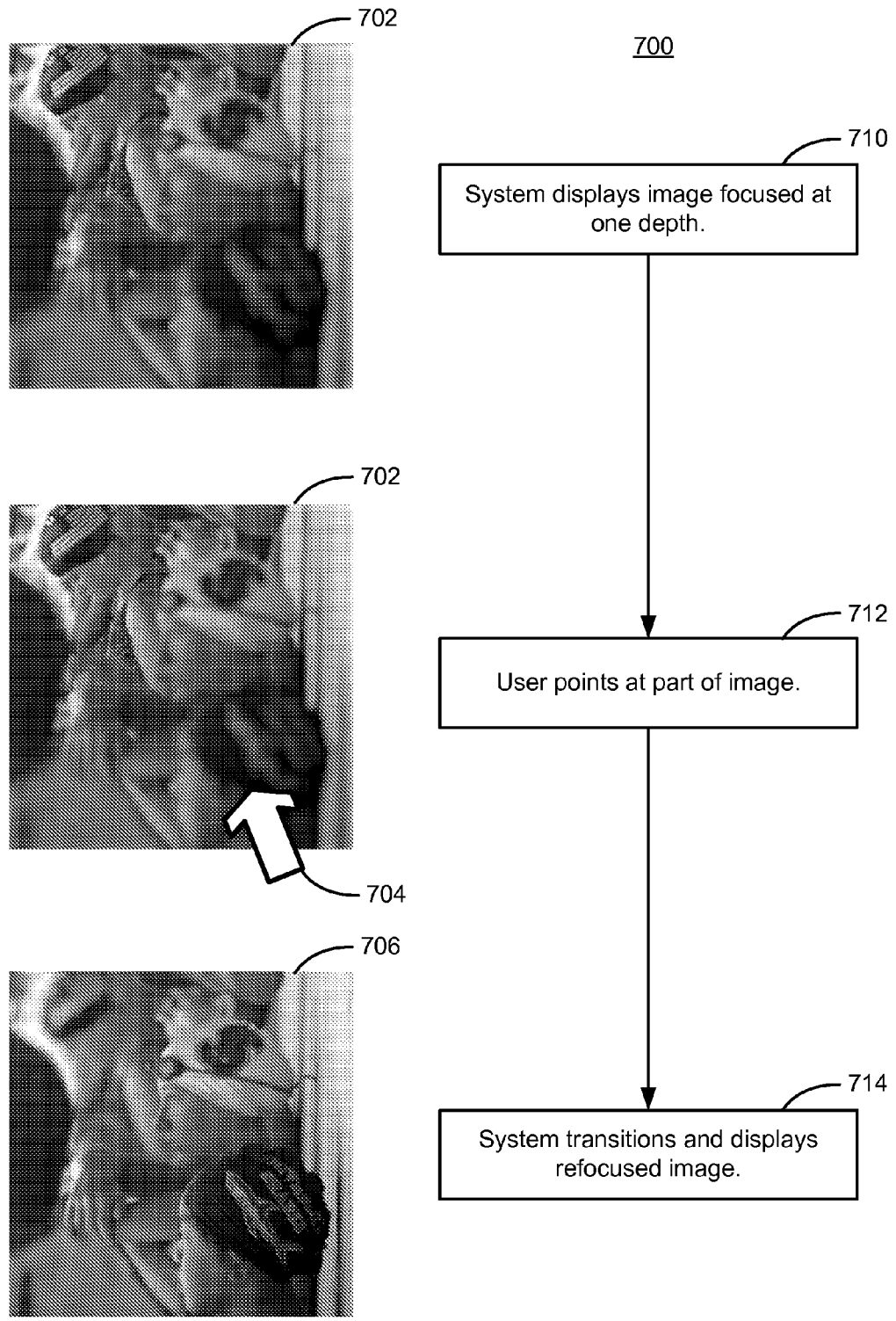
FIG. 7 is a flow diagram illustrating a process for performing interactive digital auto-focus in accordance with some embodiments, along with corresponding images.

A specific exemplary embodiment of the invention provides a style of interaction described here as interactive digital auto-focus (IDA). In IDA, the user points to a 2D position within a 2D display of a refocusable image, and the appearance of focus in the image changes in response to the user's gesture. FIG. 7 illustrates a process 700 for performing IDA in accordance with some embodiments, along with corresponding images. In the process 700, a system displays (710) an image 702 focused at one depth. A user points (712) at part of the image 702 (e.g., with a pointer icon 704). The system transitions (714) and displays a refocused image 706.

User Gestures

Without limiting generality, the point at which the users points will often be referred to below as the "click point" in analogy to the pointing afforded by a mouse. Nevertheless, those skilled in the art will recognize that the user need not necessarily click with the mouse. In some embodiments, simply moving the mouse and having its position recorded may provide a continuum of "click points." In other embodiments, the generation of a click point may occur discontinuously, only at times when the user indicates a distinct choice has been made. For example, the user may click or double click with a mouse, press a button, or tap with a stylus on a touch-sensitive screen, etc.

With regards to this last point, those skilled in the art will also recognize that the user's pointing gesture may be transmitted to the system through any of a number of methods and user interaction subsystems. For example, the user may use a pointing device such as a computer mouse, a touch-pad, touch-sensitive screen, a stylus pressed upon a tablet or screen, a Wacom™ tablet, an eye-tracking device, a joystick, a four-way button navigation control, a pressure-sensitive directional navigation control, sliders, clickwheels, circularly shaped touchpads, and more.

Interactive Change in Global Focus Appearance

In one exemplary embodiment, the response to the user's gesture is for the displayed image to be refocused to bring the region in the vicinity of the "click point" into maximal focus. For example, the focal plane of the image may be altered.

Figure 9:
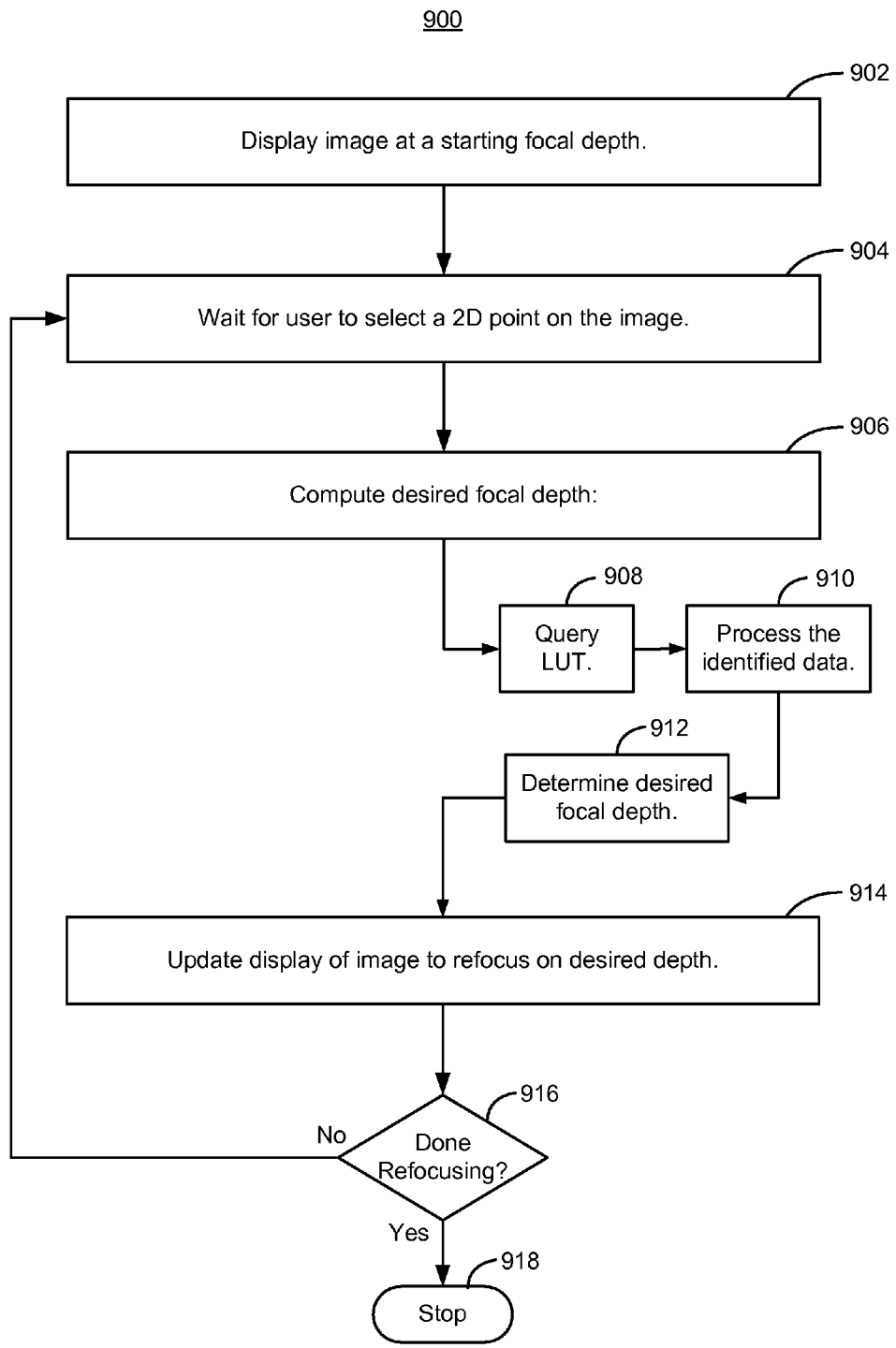
FIG. 9 is a flow diagram illustrating a process for interactive refocusing with a LUT in accordance with some embodiments.

In some embodiments, the interaction system utilizes a pre-computed LUT and an array of refocused images to implement this interaction efficiently. FIG. 9 is a process flow diagram illustrating a process 900 for interactive refocusing with a LUT in accordance with some embodiments. In the process 900, an image is displayed (902) at a starting focal depth. The system waits (904) for the user to select a 2D point on the image. The desired focal depth is computed (906): the LUT is queried (908), the identified data is processed (910), and a desired focal depth is determined (912). Display of the image is updated (914) to refocus on the desired depth. If refocusing is done (916—Yes), the process 900 is complete (918). Otherwise (916—No) the system returns to operation 904.

In some embodiments, the array of refocused images exhibit smooth changes in focus—e.g. the change in world focal depth is roughly proportional to $1/z$, where z is the distance of the world focal plane from the camera—and the LUT simply records the index of the image for which maximal focus is obtained for each 2D pixel location. When the user generates a pointing gesture on the displayed image, a 2D click-point is recorded as a 2D location on the image. The displayed image is transitioned from the currently displayed image to a display of the image at the index returned by the LUT for the 2D click-point (FIG. 9).

In some embodiments, it may be desirable to transition between the focal depth before and after the user points at the screen, in order to provide visual clues as to the motion of the change. In these embodiments, the picture animates through a series of focal depths in between the depths before and after the click. For example, the transition occurs quickly, in order to provide the perception of a smooth but rapid transition to the user's desired choice. In one specific exemplary embodiment, the transition occurs over approximately 100 milliseconds, and animates through approximately 3-5 frames focused at intermediate depths.

In some embodiments, the set of pre-computed images exhibits smooth changes in focus from frame to frame. (For example, they may be computed by regular changes in the separation between the virtual image plane and the camera lens during digital refocusing.) In this case, the transition can occur simply by animating between the frames at a constant rate. For example, if the starting image were at index 5 in the array of images, and the target image were at index 8, the system would display, in order, images 5, 6, 7 and then 8 with roughly even time durations in between.

In other embodiments, the set of precomputed refocused images may not exhibit smoothly varying focus. For example, some of the refocused images may have been removed from the set according to one of the methods described in the section on pre-processing for compactness. In this case, the separation between the virtual image plane and the lens may be stored with each image or deduced from information stored with the image. The animation presented by the system to the user approximates a smooth transition of this separation by conceptually animating through a smooth series of desired separations, and displaying the precomputed image with the closest separation.

Figure 10:
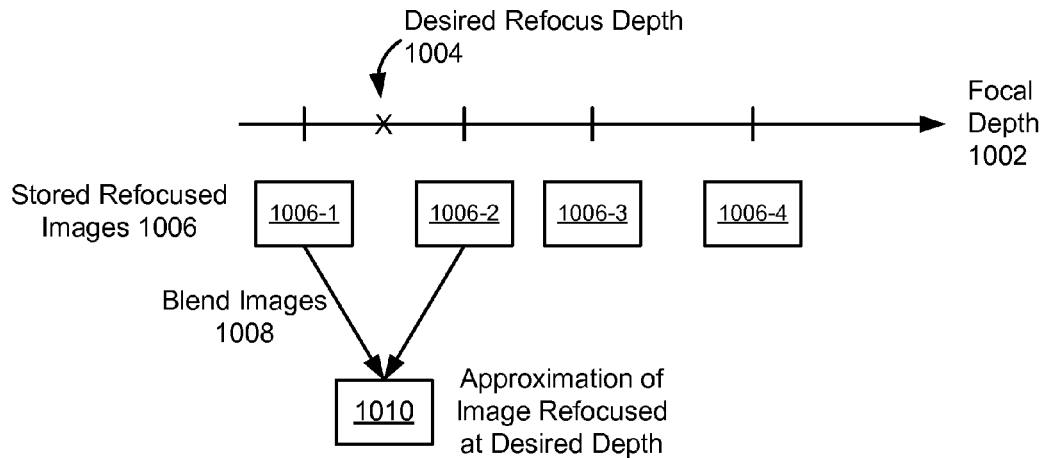
FIG. 10 illustrates blending between images to compute a desired refocus depth on a continuous scale in accordance with some embodiments.

FIG. 10 illustrates blending between images to compute a desired refocus depth on a continuous scale in accordance with some embodiments. In some embodiments, when a frame at a separation that is desired by the display subsystem (e.g., desired refocus depth 1004, FIG. 10) is not exactly available in the set of precomputed images (e.g., stored refocused images 1006), blending (1008) may be used between images that are at nearby separations (e.g., images 1006-1 and 1006-2). For example, linear blending between the two images at the nearest separations may be used. In particular, if the desired separation is S, and the two images with nearest separations are image I0 and I1 with separations S0 and S1, then the blended image, I (e.g., image 1010), for display to the user may be computed by linearly blending the pre-computed images according to the following formula:

$$I[x,y] = |(S-S0)/(S1-S0)|*I1[x,y] + |(S-S1)/(S1-S0)|*I0[x,y],$$

where I[x,y], I0[x,y] and I1[x,y] are the pixel values for images I, I0 and I1 at pixel location (x,y).

Figure 11:
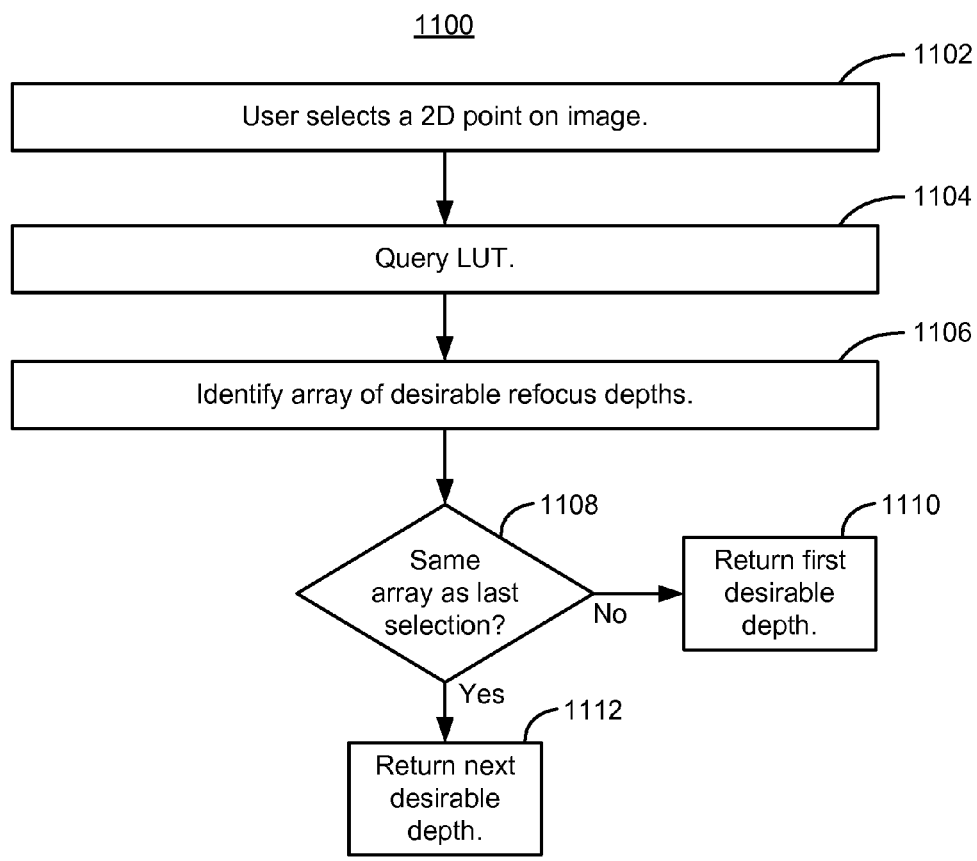
FIG. 11 is a flow diagram illustrating a lookup process for a LUT with multiple refocus depths for each cell in accordance with some embodiments.

In some embodiments, the LUT may contain not a single desired focal depth, but rather a set of interesting focal depths, as described in the section on pre-processing. In an exemplary embodiment, the system may cycle through this set of images as the user clicks repeatedly in a region. FIG. 11 is a flow diagram illustrating details of the LUT computation with regards to the higher-level flow diagram for IDA with a LUT shown in FIG. 9 in accordance with some embodiments. In the process 1100 of FIG. 11, the user selects (1102) a 2D point on an image. The LUT is queried (1104) and an array of desirable refocus depths is identified (1106). If the array is not the same array as the last selection (1108—No), a first desirable depth is returned (1110). If, however, the array is the same array as the last selection (1108—Yes), the next desirable depth is returned (1112). For example, in the vicinity of the picture near the boundary between a person and the background, clicking repeatedly may change the focus from the person to the background.

In another embodiment, the change in focus described here need not be pre-computed. Instead, the raw light field data may be stored in a backup memory, and refocused images may be computed on-the-fly and displayed to the user directly from the raw data. This approach provides maximum flexibility, as all the original lighting data is present. However, the computational burden is greater.

In yet another exemplary embodiment of the present invention, refocusable images are stored on an Apple® iPod®, each encoded as a set of images focused at different depths. The user uses the circularly shaped touchpad to scroll through the refocusable images and select one. When selected, the circularly shaped touchpad is used to refocus at closer and further depths. Similar techniques can be employed with other digital media players. In another embodiment, the refocusable image is encoded as a short video clip. The user selects refocusable images as before, and in this case scrolling through the frames of the video causes the appearance of the image to refocus closer and further.

Interactive Editing of Local Focus Appearance

Another exemplary embodiment of the present invention uses a painting-style interaction to allow the user to alter the focus of the image. In this case, the user is not simply changing a global depth of focus that affects all pixels at once, but rather altering the focus characteristics in a subset of the pixels. In some embodiments, the subset of pixels is in a neighborhood of the user's selected point of the image.

An exemplary embodiment of the invention includes a subsystem for interactive focus editing by a user. Various virtual tools are provided, and the user may select different tools to activate its use and modify the behavior of the system with respect to the user's gestures. In this regard, an exemplary embodiment of the system is implemented in a software package similar to commercial image editing software, but different in that the present invention provides edit control over the appearance of optical focus.

Figure 18A:
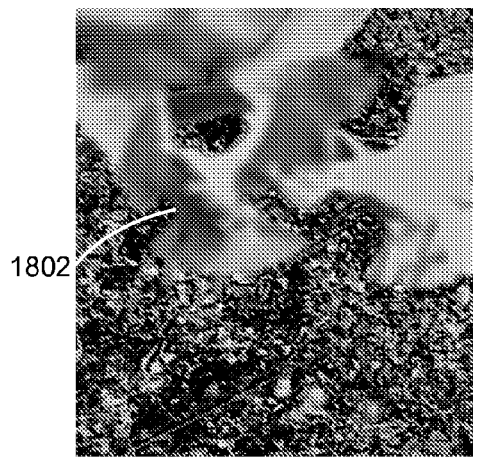
FIGS. 18A-18C illustrate a user interface to control displayed focal depth with a virtual brush tool in accordance with some embodiments.
Figure 18B:
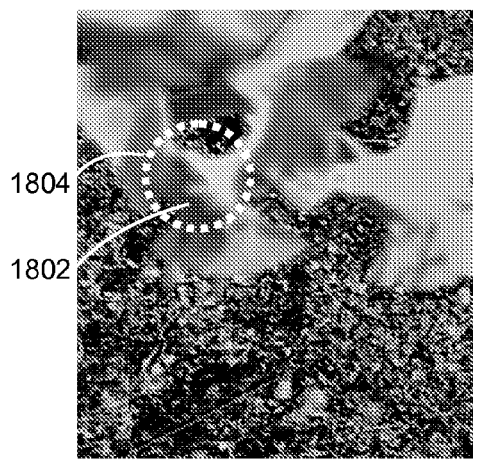
Figure 18C:
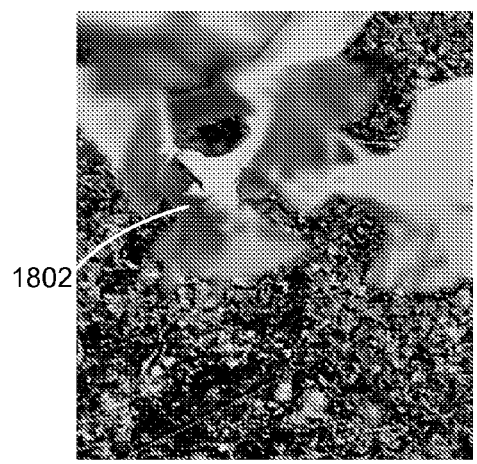

In an embodiment of the present invention, focus is controlled with a virtual brush tool that the user can "paint" over a displayed representation of the current image. For example, the user can click and drag with a computer mouse to define regions to be affected by the brush tool. The effect of the tool is to change the chosen focal depth for pixels in a neighborhood of where the user indicates. This effect is illustrated in FIGS. 18A-18C in accordance with some embodiments. FIG. 18A displays an image that includes an object 1802, which in this example is a bird. In FIG. 18B, a virtual brush tool icon 1804 is painted over the head of the bird 1802. In response, the focal depth for pixels within the icon 1804 is changed to bring the head of the bird 1802 into focus, as illustrated in FIG. 18C.

Figure 12:
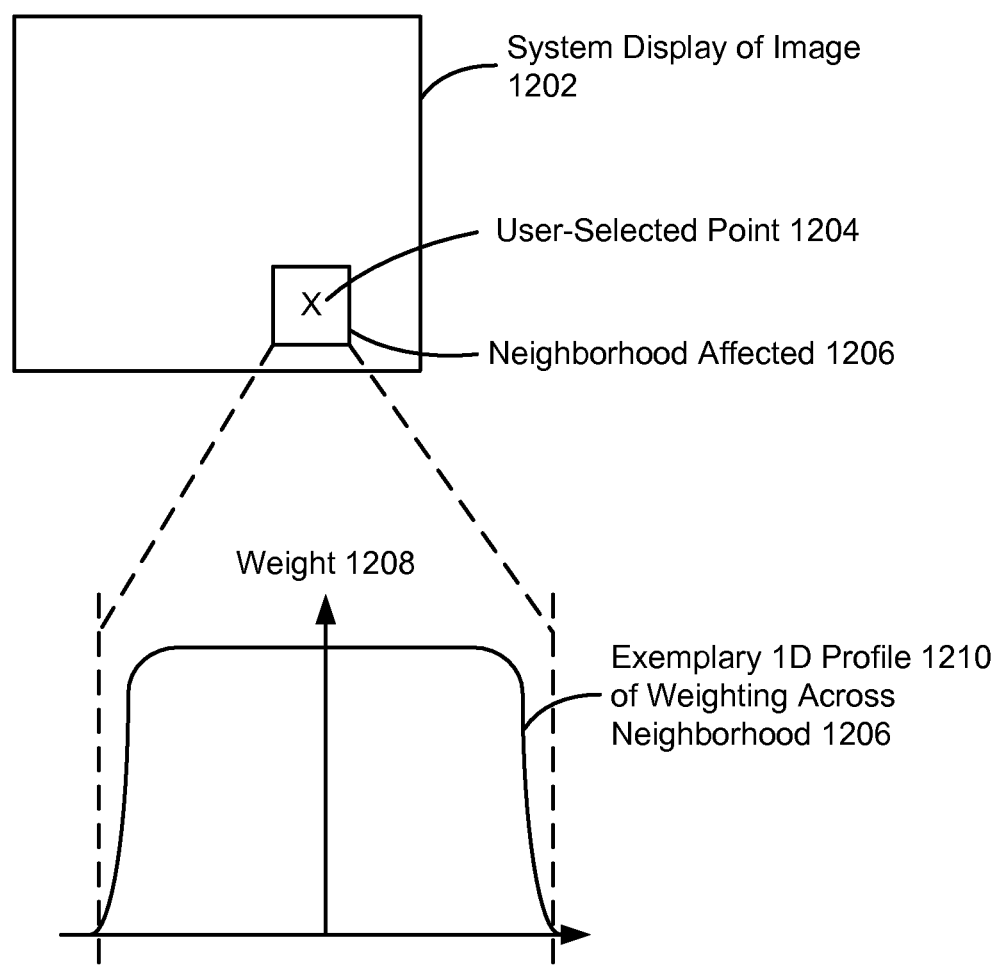
FIG. 12 illustrates a neighborhood to be interactively refocused in an image and a corresponding weighting profile in accordance with some embodiments.

The affected neighborhood can be chosen and affected by the user in a number of ways. In one embodiment, the size and shape of this neighborhood can be set as global system parameters. The neighborhood is centered about and moves with the points indicated by the user. In other embodiments, each position in the neighborhood may have a weight associated with it that modulates the rate of change when the user uses the tool to perform edits. FIG. 12 illustrates this neighborhood 1206 on the system's display of the image 1202 to be interactively refocused in accordance with some embodiments. In FIG. 12, the weight 1208 of pixels in the neighborhood 1206 is indicated through a 1D profile 1210 of an exemplary brush weighting function. In this example, the weights may decrease gradually from the center of the neighborhood to its periphery, in order to cause a smooth transition in the effect from where the user indicates (e.g., user-selected point 1204) to surrounding regions of the image.

In another embodiment of the system where a pressure-sensitive input device is used, such as a touch-sensitive screen, the pressure with which the user applies the tool may be used to increase or decrease the size of the neighborhood and to modify the weights in the neighborhood. For example, the diameter of the neighborhood and weights within in may be chosen to be proportional to the pressure.

Figure 13A:
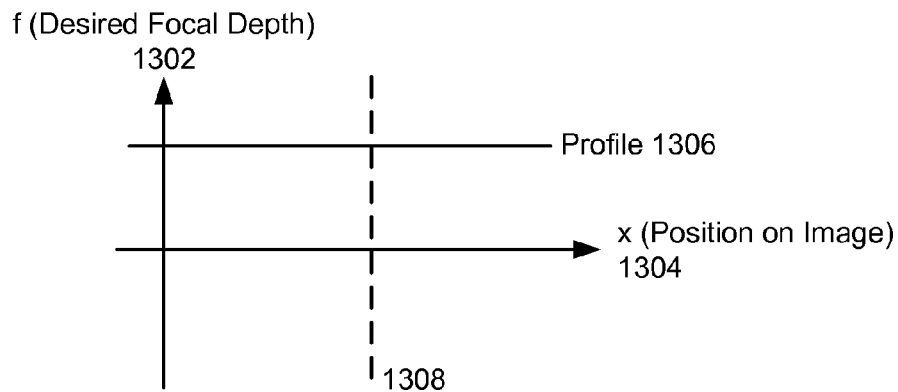
FIGS. 13A-13C illustrate interactive painting to alter local focus depth in accordance with some embodiments.
Figure 13B:
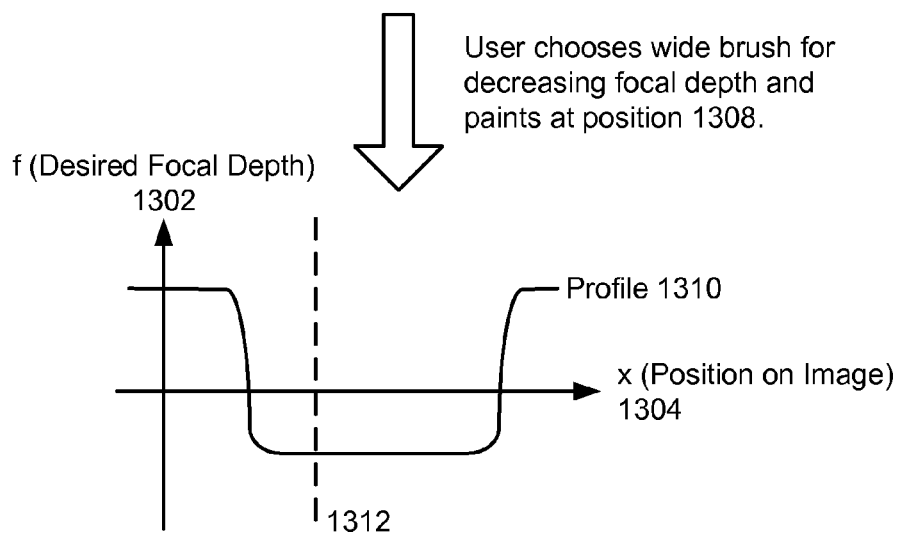
Figure 13C:
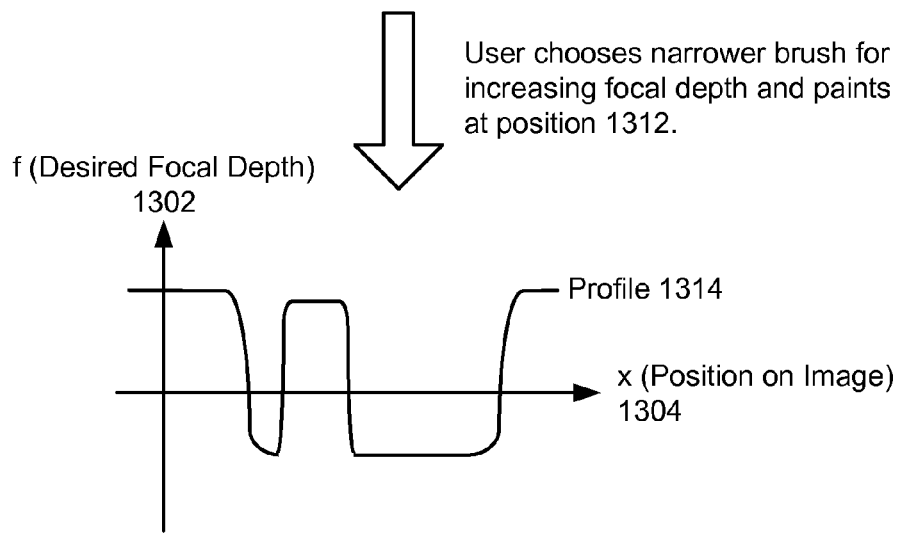
Figure 14:
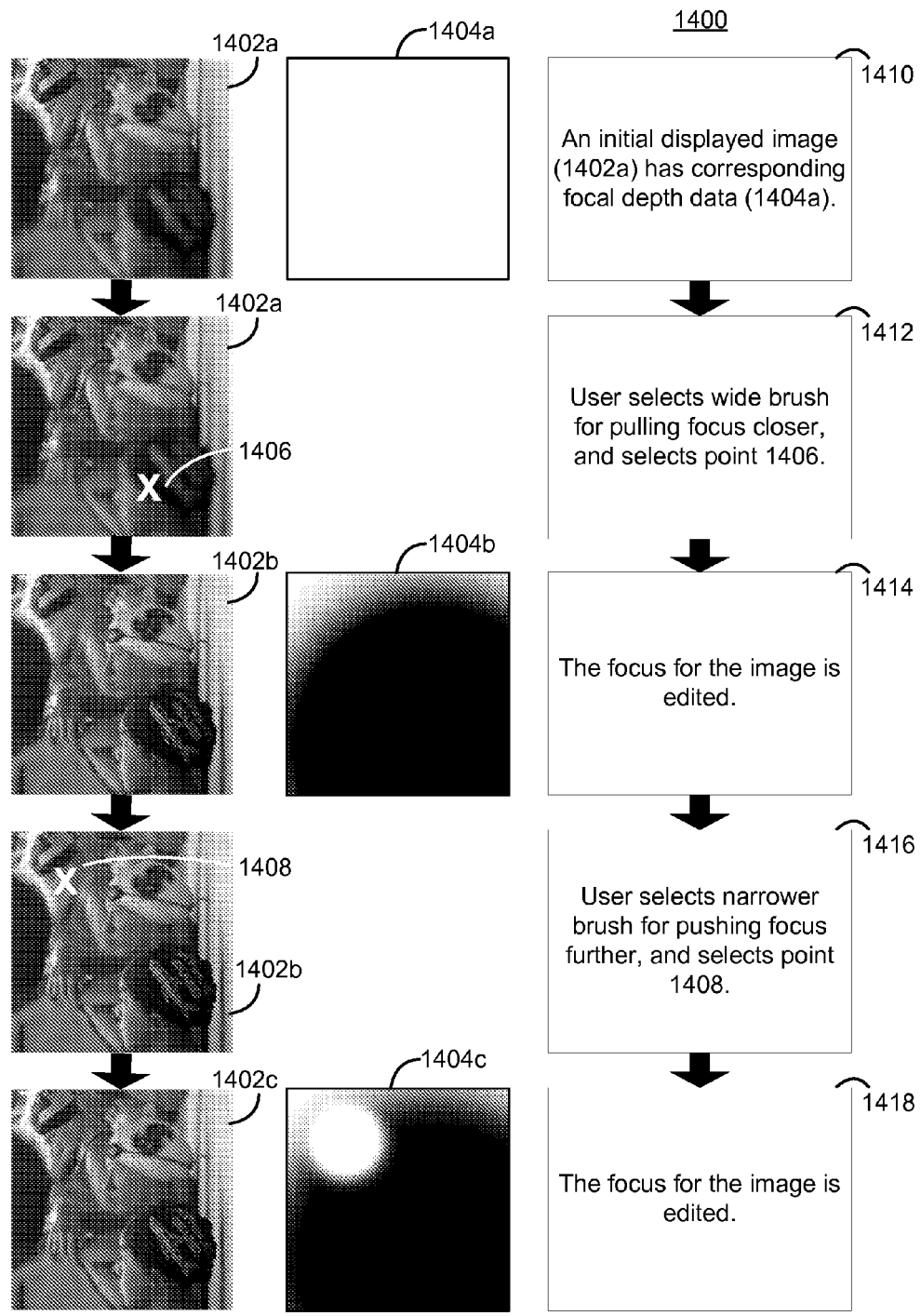
FIG. 14 is a flow diagram illustrating a process for interactive painting to alter local focus depth, along with corresponding images and desired focal depth visualizations, in accordance with some embodiments.

In an embodiment of the present invention, applying the brush tool causes the displayed focal depth to move further or closer away in the neighborhood. Through a series of edits with the brush tool, possibly with alterations of the size and weighting of the neighborhood affected by the tool, the user can modify the world focal plane into a general world focal surface. For example, the user could interactively change the depth at which each pixel is focused, in order to bring the entire image into focus at once. FIGS. 13A-13C illustrate how the 1D profile of desired focal depths is modified (e.g., from profile 1306 to profile 1310 to profile 1314) by the user in two such painting steps in accordance with some embodiments. Or he or she may selective sharpen only portions of the image, such as the people in the scene, allowing other areas to remain slightly out of focus in order to draw attention to the desired subject of interest for artistic reasons. FIG. 14 illustrates in 2D a process 1400 in which the local focus within an image can be interactively modified to bring both a person in the background and a person in the foreground to be in focus at the same time, in accordance with some embodiments. In FIG. 14, the images 1404 in the second column are visualizations of the desired focal depth, where white represents further depths, and black represents closer depths. In the process 1400, an initial image 1402a is displayed (1410). The user selects a wide brush for pulling focus closer and selects (1412) point 1406. The focus for the image is edited (1414), resulting in image 1402b. The user selects a narrower brush for pushing focus further away and selects (1416) point 1408. The focus for the image is edited, resulting in image 1402c.

Whether the focal depth is increased or decreased may be chosen in a number of different ways. In an exemplary embodiment, pressing the left mouse button to apply the tool causes the focal depth to increase; pressing the right mouse button causes it to decrease. In another exemplary embodiment, pressing and holding the shift key while dragging changes the direction in which the focal depth is moved by the system.

In another embodiment of the system where a pressure-sensitive input device is used, such as a touch-sensitive screen, the system scales the rate of change in the chosen focal depth so that it is proportional to the pressure exerted by the user. For example, pressing harder with the stylus may cause the focus plane to push away or pull closer more rapidly. In some embodiments, the user may set a value within the system to globally scale this rate of change. For example, it may be set on a property sheet in a program, or through a text box or a slider.

Figure 15:
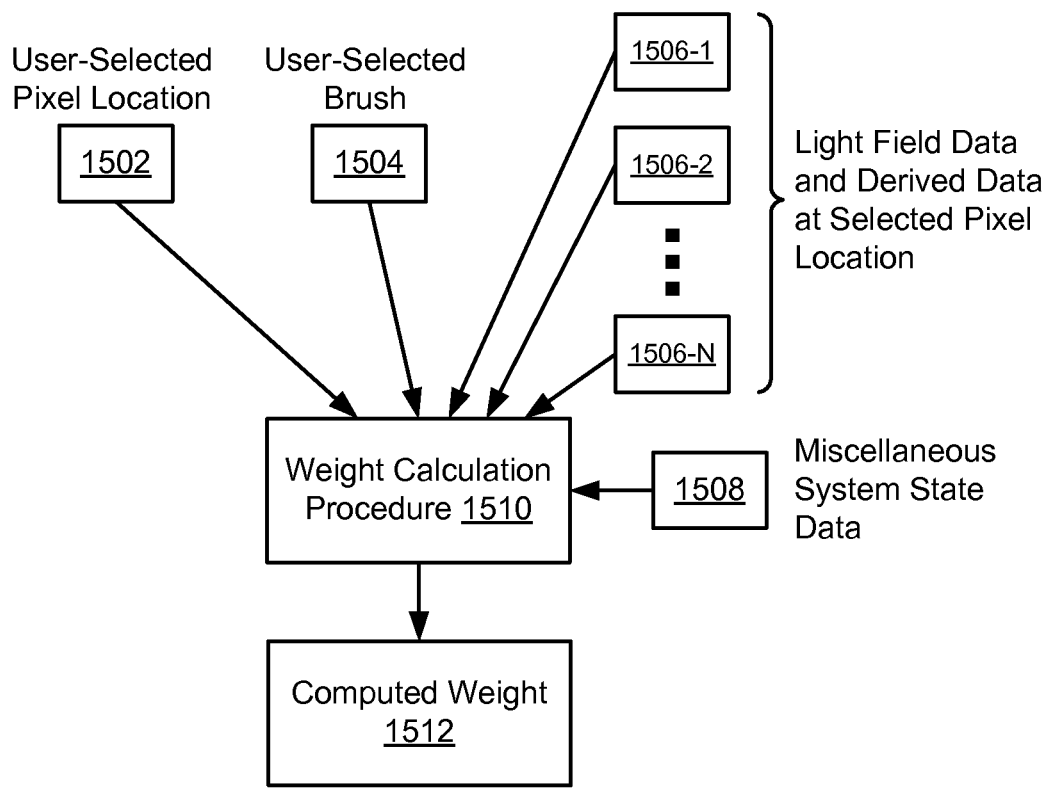
FIG. 15 is a block diagram illustrating a calculation of weight applied to a pixel in a neighborhood.

In yet another embodiment, the weight of each pixel in the neighborhood may also be affected by the properties of the rays associated with the pixel where the weight applies (FIG. 15). A weight calculation procedure 1510 receives as inputs a user-selected pixel location 1502, a user-selected brush 1504, light field data and derived data 1506 at the selected pixel locations, and miscellaneous system state data 1508 and produces a computed weight 1512 as output. For example, the weight could be decreased or set to zero for output image pixels where the character of the rays differs greatly from the pixel indicated by the user. Without loss of generality, an illustrative example can be found in considering painting on a face in a refocusable image, where the person is standing in front of a distant background. By clicking on the user's face, the system alters the focus of pixels determined to be part of the user's face, but not part of the background.

In one embodiment, the determination is based on similarity of the estimated depth of neighboring pixels to the estimated depth of the object at the pixel indicated by the user. Neighborhood pixels where the difference in depth is larger are affected less by the brush tool. In another exemplary embodiment, the determination is made based on a comparison of the partial derivatives of the 4D light field at each pixel in the affected neighborhood of the click point. For example, if $L(x,y,u,v)$ is the ray of light passing through $(u,v)$ on the aperture and $(x,y)$ on the imaging plane, then the derivatives of $(x,y)$ with respect to $(u,v)$ at a pixel of interest $(x0,y0)$ and, say, at the center of the aperture $(u=0,v=0)$ can be used as an indicator related to the depth of the object at that pixel. Neighborhood pixels are affected by the brush tool less, where the difference between the derivative at that pixel and the derivative at the click point is greater. In other exemplary embodiments, other partial derivatives, or mathematical combinations of such derivatives, are used to provide points in the neighborhood with a numerical measure, and different points are processed in different ways based on the proximity of their measure to the measure at the user's click point.

In other exemplary embodiments, other techniques, including Bayesian image segmentation techniques, may be used to estimate which pixels are part of which objects.

In yet another embodiment of the system, use of the brush tool is coupled with IDA. When the user applies the tool, the pixels affected by the neighborhood are moved towards the depth that would have been chosen by IDA. If the tool is applied for long enough, all pixels will end up focused. The rate at which each pixel in the neighborhood approaches its terminal depth is affected by the weight of the brush at that point in the neighborhood.

In yet another embodiment of the system, the user selects a tool that allows automatic refocusing of entire objects. An example scenario is for the user to click on all the faces in a scene, causing them to become fully focused, without altering the focus on the background. In one exemplary embodiment, pixels surrounding the click point are analyzed by the system in order to determine whether they are part of the same object. In one embodiment this is estimated by determining whether the estimated depth of the objects at these pixels varies continuously from the click point. If they do, the pixels are contained in the same object, otherwise they are not. In one embodiment the depth is estimated using the technique of Adelson and Wang that is cited above.

In yet another embodiment of the system, the user selects a tool that allows automatic unfocusing of entire objects. An example scenario is for the user to click on the background in a displayed image of the scene, causing the background to become unfocused by a desired amount without altering the focus in closer objects. In an embodiment, the user sets the desired level of focus blur in the system before beginning to click on the displayed image.

In an exemplary embodiment of the system, the desired level of focus is stored as a value at every output display pixel, such that it can vary at a per-pixel level. In another exemplary embodiment, the value is represented and stored as a single fixed-point number per pixel. For example, the value represents the relative separation between the virtual image surface and the lens at that pixel location. In another exemplary embodiment, this array of values can be stored in a file with the image data for later use.

Image Segmentation

In another embodiment of the present invention, 2D image segmentation is enhanced by utilizing the extra light field and focus data at every image pixel. Interactive segmentation of a desired region of pixels is sometimes implemented with a region growing procedure, where the user lays a seed, and an algorithmic procedure is used to extend that seed location to a region with similar properties.

In the present invention, such techniques can be enhanced based on the extra information underlying every output image pixel. Instead of growing the region only in 2D, the region can be grown in the 4D space of rays. For the purpose of region growing, proximity of samples is extended straightforwardly from 2D images to 4D ray space. Just as proximity in a 2D image is defined by Euclidean distance in the image plane, proximity in the 4D ray space is defined by Euclidean distance in the 4D ray space $(x,y,u,v)$, where $L(x,y,u,v)$ is the light traveling from position $(u,v)$ on the lens aperture to position $(x,y)$ on the image plane.

In another embodiment, the 4D ray-space segmentation may be projected onto 2D in order to produce a very well antialiased representation of a region of interest. The final appearance of a pixel in the displayed image is a blend of all the rays contributing to that pixel. Image editing operations applied to the 4D segmentation only partially affect the contribution of each pixel, and produce superior antialiased results especially along image boundaries. As an illustrative example, suppose that the user selects a region of ray-space corresponding to the rays emanating from a face in the scene that is partially out of focus. The user may select the inverse of this selection in order to obtain the pixels corresponding to all the other parts of the scene.

In some embodiments, the user may seed the 4D segmentation by clicking on the 2D representation of the image. Since the clicked pixel is backed by a 2D array of rays, there is a choice about which 4D ray to choose as a starting point, and different choices lead to different system tradeoffs. One point is that when the user interactively refocuses the representation of the output image, this causes a re-parameterization of the underlying 4D ray space, and affects the set of rays that terminate at each output pixel. In one embodiment of the system, the exact set of rays corresponding to each output pixel is defined by analogy with a real camera system. The pixel value at a location in the displayed image is the sum of all the rays passing through that pixel on the virtual image plane for that refocus depth. Refocusing corresponds to altering the location of this virtual image plane. Thus, the set of rays backing that pixel location is simply the set of rays that originate from different points of the virtual lens aperture and that terminate at that virtual pixel location.

In one exemplary embodiment, the ray can be chosen simply as the central ray (i.e. the ray passing through the center of the conceptual lens aperture). In another embodiment, it may be any representative ray from the largest set of rays at that location—a set being defined by having approximately the same color.

Alternative Visualizations

In another embodiment of the present invention, interactive editing of focus is enhanced by providing a visualization of the rays at each output display pixel. In one exemplary embodiment, digitally zooming in beyond 100% zoom (i.e. where a single output pixel falls across multiple screen pixels) causes the system to display a visualization of the directional distribution of light at that output pixel. For example, the visualization takes the form of a circular disk that is an image of the virtual aperture of the lens. This is not simply the disk that appears under the corresponding microlens on the sensor in the physical light field camera. Rather, this is the light that would have arrived at the pixel location on the virtual focal plane had it been present in the camera at that depth at the time of exposure. This disk changes as the desired refocus depth changes. In a specific embodiment, the disk for a lens is computed by tracing rays starting from A to B, where A is the 3D position that comprises that output pixel location on a virtual focal plane at the refocus depth that is being displayed for that output pixel, and B is a point that varies over all positions on the lens aperture. Each such ray corresponds to a point in the disk to be visualized according to its position on the lens aperture. And each line passing through such a ray intersects the actual microlens lens plane inside the camera at, say, position (x,y), and the actual aperture of the lens at position (u,v). The color of the pixel in the disk is set to L(x,y,u,v). Another way of saying this is that this embodiment simulates the image that would have appeared under each output pixel had the output pixel existed as a microlens backed by an array of pixels inside the camera at the desired refocus depth at the time of exposure.

Interactive Refocusing of Images Embedded in Web Pages

In another exemplary embodiment of the present invention, an enhanced image representation is loaded onto a web page, providing viewers of the web page with interactive control over the appearance of focus in the image. For example, the user may interact with the image in order to bring parts of the image that would otherwise be blurry into focus. For example, the user may interact with the web page to refocus the image at different depths, say to focus first on a sportsman in the foreground and then on a sportsman at a further depth. In the following, such an enhanced image is referred to generically as a "rephoto."

In some embodiments of the invention, the rephoto representation consists of a collection of static image files and a look-up-table file. The image files may be stored, for example, in jpeg (Joint Photographic Experts Group), gif (Graphics Interchange Format), or png (Portable Network Graphics) formats, or any other format that may be viewed through a web browser. The look-up-table file may be stored in a human-readable text format, or in a binary format that may be compressed for efficiency.

Figure 16:
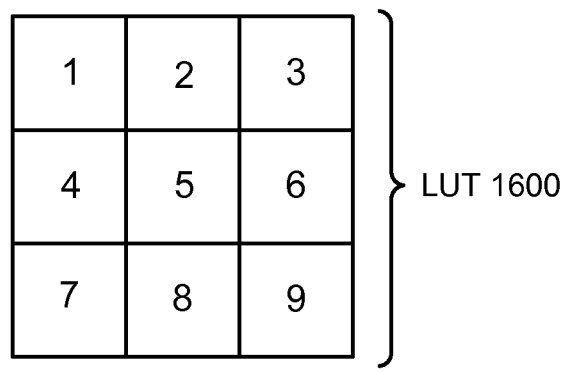
FIG. 16 is a block diagram illustrating index values for a LUT data structure in accordance with some embodiments.

In a specific exemplary embodiment, the look-up-table file contains the values of a look-up-table calculation as described above in the section on pre-computation, and is stored as a text file containing the 2D array of look-up-table values as a string representing a Javascript 2D array. As an example, if the look-up-table data structure consisted of the index values shown for LUT 1600 in FIG. 16, the look-up-table file would be encoded in a text file containing the string "[[1,2,3],[4,5,6],[7,8,9]]". In this embodiment the file is loaded by a Javascript program using an XMLHttpRequestObject to load the file as a string, and loading it into a 2D Javascript array using the Javascript eval function. As the user clicks at different points in the image, the program uses the look-up-table to determine which frame of the movie is desired, and changes the corresponding image on the web page to display the desired frame to the user.

In another exemplary embodiment the data structures are stored in a Macromedia® (now Adobe®) Flash file format. For example, in one embodiment the frames focused at different depths are stored as the frames of a Flash movie clip, and the look-up-table data structure providing the index for the frame of maximum focus for each (x,y) is stored as a 2D array of indices in an associated Actionscript program. As the user clicks at different points in the image, the program uses the look-up-table to determine which frame of the movie is desired, and advances the Flash movie to display the desired frame to the user.

In another embodiment, the look-up-table contains a real-valued number rather than an integer index, and image blending is used to interpolate between the nearest stored frames in order to display approximate images at any continuously indicated depth by the user.

Figure 17A:
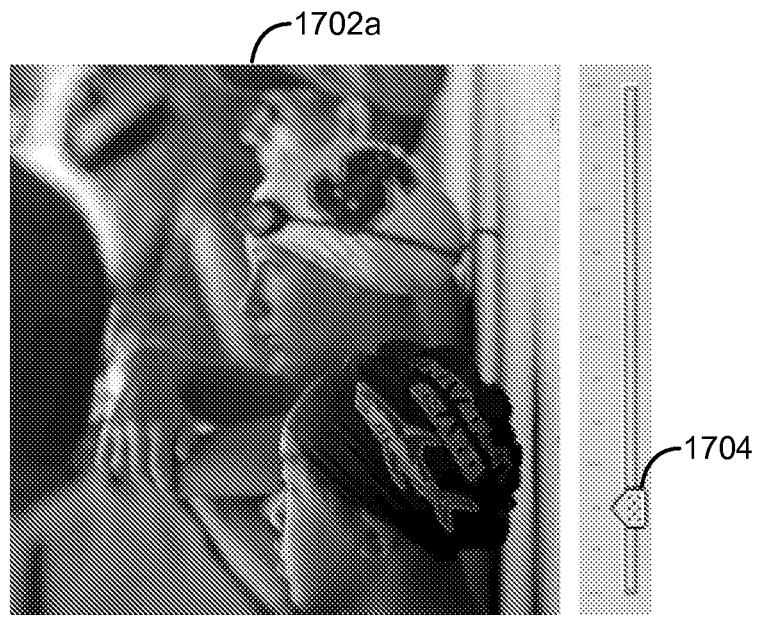
FIGS. 17A & 17B illustrate a user interface to visualize and control displayed focal depth in accordance with some embodiments.
Figure 17B:
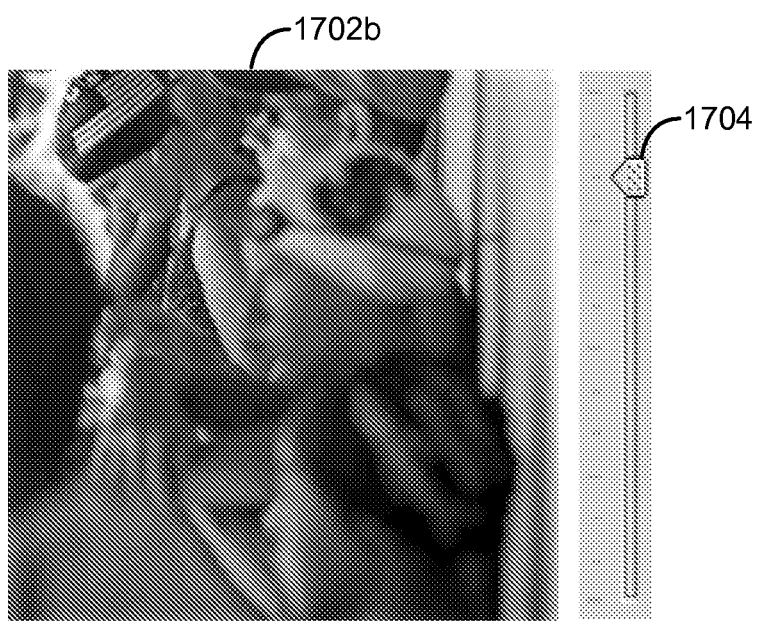

In another embodiment, the value of the currently displayed refocus depth is displayed to the user, and the user can modify this value directly in order to visualize the image refocused at a desired depth. According to an exemplary embodiment, the value is displayed and/or modified through a user-interaction (UI) component such as a slider and/or a textbox containing a number. In one example (FIGS. 17A & B), the slider 1704 is oriented vertically so as to provide the user with a more intuitive feeling of focusing further (sliding the slider upwards) (e.g., for image 1702b, FIG. 17B) and focusing closer (sliding the slider downwards) (e.g., for image 1702a, FIG. 17A).

In yet another embodiment of the invention, the updates to the image occur on a per-pixel basis, and these computations are performed on a server. Instructions for which updates are desired are triggered by the user on a client computer that is connected to the server via a network. The instructions sent from the client to the server may include, but are not limited to mouse click points, pressure information, which keys are pressed if any, current tool selections, etc. The server may respond by computing an appropriate change in the appearance of the image, and downloading the updated image (or region thereof) to the client in order for update of the image presented to the user at the client machine.

In yet another embodiment of the invention, the computations for the update of the image embedded in the web page occur on the client computer, via a web plugin software module. According to an exemplary embodiment, the computations could be programmed in a Java applet.

In yet another embodiment of the invention, the updates to the image occur partially on a network server, and partially on the client computer.

In yet another embodiment of the invention, the client computer referred to above is actually a cell phone, and the interactive image appears on the cell phone's display. According to the embodiments described above, the computations for image update may occur partially on the cell phone, for example on an embedded processor, and partially on a server computer to which the phone sends instructions over a network.

Semantically Tagged Images that can be Interactively Refocused

Having semantic information attached to an image provides additional cues for the user to explore an image. Portions of 2D images may be tagged, as shown for example on the flickr.com website. In an embodiment of the present invention, an enhanced form of tagging is shown where the tags are applied and associated with a certain appearance of focus. According to an exemplary embodiment, consider a system providing the user with the ability to interactively change the global focus in an image. Tags may be associated with specific regions of the image when they are focused at a particular depth. For example, a refocusable image may be tagged with the name of a person's face when the person's face comes into focus. In a specific exemplary embodiment, a user sets such tags on the image in "edit mode" by refocusing the image to a desired depth, highlighting a region of interest on the image, and labeling the region with a desired description. The system stores this information for later use. The stored information for each labeling may include the description, a representation of the 2D highlighted region, and the depth at which the image is refocused. In "view mode," a user interacts with the tagged image and learns of the stored tagging information. In an exemplary embodiment, the user is shown the image overlaid with the highlighted regions and descriptions. If the user selects a highlighted region, the display system refocuses the image onto the depth associated with that tag. In another embodiment, the tagged regions are simply listed by their descriptions without being overlaid on the image. When the user selects a description, the image is refocused on the depth associated with that description.

In another embodiment of the system, the system automatically creates a series of interesting regions on the image, and asks a user to provide labels for them. In an exemplary embodiment, the interesting regions are computed automatically as follows. First, the system computes a measure of focus clarity for each image refocused at a different depth. In a specific exemplary embodiment, the measure is the 2D gradient magnitude of the image. Second, for each image, the system clusters pixels of high focus clarity to create a number of clusters in each image. Each of these clusters is a highlighted region that is stored.

In another embodiment, the system automatically finds good tags for the images based on other tags that users have provided it. For example, if the system determines that a particular person's face appears in a number of images, then if a user provides a label for a highlighted region of that person's face in one image, all other images may be tagged with it as well.

In another embodiment, the highlighted region may be 3D rather than 2D. In an exemplary embodiment, the user creates such a region by selecting a number of 2D regions on a number of different refocus depths, and instructs the system to combine these 2D regions into a 3D union.

Files and Data-Structures

In the present invention, the raw data and/or processed derivative pieces of data are stored in electronic files and/or data structures. These may exist, for example, on a computer's hard drive or in its memory. The basic requirement is storing sufficient information to enable changing the perceived focus of an output image from the stored data.

Component Data Structures and Encodings

Different embodiments of the invention encode the light field data and peripheral data in different ways to achieve different goals and provide different tradeoffs of performance and cost. There are a number of pieces of component data that are logically associated and encoded in accordance with some embodiments. The following paragraphs discuss various types of such component data and different ways of encoding them for use in the present invention.

One type of component data is the raw light field data. In some embodiments, the data is encoded in the format of a raw 2D image read off a sensor in a light field camera. For example, in some embodiments of a light field camera system, the encoded file viewed as a 2D image appears as an array of disks, where each disk is an image of the aperture of the camera system from that position on the imaging plane. The image may be stored directly in a compressed 2D image format, such as JPG, JPG-2000, TIFF, etc.

In other exemplary embodiments, the data is encoded according to different 4D light field representations of the recorded data. For example, the sub-aperture images of the image may be extracted, and stored as a collection of images. In an exemplary embodiment, the images are strung together as a sequence that represents a raster-ordering of (u,v). This produces an animation of the sub-aperture images that is compressed using MPG-style movie compression. In another exemplary embodiment, the MPG-style compression is extended to 4D in order to exploit the coherence of the data not only in a sequential ordering, but rather across both u and v simultaneously.

In another exemplary embodiment, 4D light field component data is encoded by storing the basis coefficients after projection onto a 4D wavelet basis. Techniques such as non-linear approximation and an extension of zero-tree encodings from 2D to 4D are used to minimize the number of coefficients that have to be stored directly.

Another type of component data is the estimated depth of the scene at every (x,y) location in images computed from the 4D light field. In some embodiments this is encoded as a floating point or fixed point depth image. In other embodiments, it may be encoded as a depth channel on a representative image.

Yet another type of component data is a set of images refocused at different depths (sometimes referred to as a focal stack), computed from the raw light field. For example, digital refocusing algorithms may be used to process a raw light field photograph to produce such a set of images.

Yet more types of component data are pieces of pre-processed data such as statistics or derivatives of the light field images interpreted as 2D images (such as sub-aperture images), 3D focal stacks, 4D light fields, or other interpretations of the data.

Yet another type of component data is the LUT data structure as described above with respect to some embodiments.

Yet another type of component data is the tagging information as described above with respect to some embodiments.

Composite Data Structures and File Encodings

Different embodiments of the present invention combine different collections of related component data for different applications. In an exemplary embodiment, the collection is encoded as a directory or folder on a file system. In a specific embodiment, the directory or folder contains refocused images and a LUT. Such a representation is used, for example, in an exemplary embodiment for providing interactive refocusing of images on a web page. An advantage of such a directory-based representation is that it may afford simpler integration with existing software systems that can read components such as images and LUT text files through native functions.

In another exemplary embodiment, the various components to be stored are encoded in a single-file archives A specific exemplary embodiment stores a directory of images and pre-processed LUT in a single zip archives. Another exemplary embodiment stores them in a Macromedia® (Adobe®) swf (Flash) format file.

In yet other exemplary embodiments, the component data are not stored as separate units within a composite encoding, but are rather interleaved in the encoding. In an exemplary embodiment, a set of refocused images and a LUT are encoded as a single "image" where each pixel consists of N+1 values, where N is the number of refocused image. The i'th value for a given pixel is the value of the i'th refocused image at that pixel, where i varies from 1 to N. The N+1'th value is the LUT value at that pixel.

Further exemplary composite encodings are determined from the 4D light field data, and only two values are stored per (x,y) location: a single color, for example the color at (u=0, v=0) at the center of the camera aperture, and the depth.

Compression

In some embodiments, the data in the storage file is represented in a compressed encoding. Specific types of compression have been discussed above with respect to specific exemplary embodiments. In some exemplary embodiments, the light field data is compressed utilizing: wavelet compression in 2D image space, 3D focal stack space or 4D light field space; JPG-style techniques; MPG-style techniques adapted to focal stacks treated as movies, or MPG-style techniques adapted to 4D light fields treated as a sequence of different views of a scene; other light field compression techniques; zip encodings; other image compression techniques; and more. If present, the LUT may similarly by compressed utilizing image compression, zip encodings, run-length encodings, or any other compression technique.

Alternative Embodiments and Variations

Refocus Animations

In another embodiment, the system presents an interface for the user to produce short, scripted movies of animation through refocus depths. The system provides the user with an interface to mark particular refocus depths as "interesting." The system then produces an animation that transitions between and pauses on the depths of interest. In another embodiment of the system, such saved animations are played autonomously for a viewer, such as in a slideshow or on a webpage gallery. User studies have found that typical viewers find much more visual interest and spend more time examining such refocus animations than their static photographic counterparts.

In yet another embodiment, the system automatically produces such scripted movies from a raw light field dataset. It does so by identifying depths of interest, such as depths with a high level of focus as described with regards to embodiments discussed above. It then applies the methods described with respect to the previous paragraph, applied to the automatically determined depths of interest.

In yet another embodiment, the system takes a set of refocused images and depths marked as of particular interest, and transitions between and pauses on randomly chosen interesting depths.

Refocus Gallery Interaction

The various exemplary embodiments discussed throughout this detailed description provide various ways to automatically compute images focused at different depths that are interesting. In another embodiment of the present invention, these various methods are combined in order to present the user with a number of images that are automatically computed and that present the scene with different focus appearances. These images are displayed in a manner that allows the user to rapidly review them and select a number of images that are pleasing and that the user would like to save for later use.

Alternative Image Acquisition Methods

Many of the embodiments discussed above involve digital refocusing of a light field data set to produce images focused at different depths. However, those skilled in the art will recognize that the present invention relates to interaction with refocusable images that may be recorded in a wide variety of ways, and that variations in the method of acquisition of the recorded data lie within the scope of the present invention.

In another exemplary embodiment of the invention that illustrates this principle, the raw image data is acquired as multiple conventional photographs recorded in succession while varying the optical focus of the recording camera. This set of images is analogous to the set of images focused at different depths that is computed from a single light field, as described above. As an example, a digital still camera could be programmed to acquire a number of images sequentially, similarly to video mode, while the focus is swept from the near focal plane of the lens to infinity. The change in focus could be produced, for example, by varying the separation between a photosensitive imaging plane and a lens, as it is in many conventional still and video cameras. In another embodiment, the change in focus could be produced by varying the shape of the interface between two liquids.

In another variation of the above method, the camera system could utilize optical auto-focus techniques in order to choose a fixed number of frames in the world where it would be desirable to focus, and take only as many pictures as necessary in succession to vary the focus over those fixed frames. For example, if the camera determines that the scene is a portrait of a person against a background, the camera could choose to automatically take just two pictures in succession, one focused on the person, and one focused on the background.

In general, the raw data described in the present invention may be produced with any system, currently in existence or that comes into existence in the future, which can produce images focused at multiple depths.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as are suited to the particular use contemplated.

What is claimed is:

1. A method of refocusing a light field image in response to user input, the method comprising:
   receiving a light field image comprising light field data;
   digitally refocusing the light field image to generate a plurality of refocused images, each having a focus depth;
   storing the generated plurality of refocused images in a storage device;
   for each of a plurality of two-dimensional positions in the light field image:
      determining which of the plurality of refocused images is in focus at the two-dimensional position; and
      storing, in a look-up table, an index entry associating the two-dimensional position with the identified refocused image;
   displaying one of the refocused images, the displayed image having a first focus depth;
   receiving user input to select a two-dimensional position within the displayed image; and
   in response to the received input:
      retrieving, from the look-up table, an index entry identifying a stored refocused image corresponding to the selected two-dimensional position, the stored refocused image having a second focus depth different from the first focus depth;
      retrieving the identified refocused image from the storage device; and
      displaying the retrieved refocused image having the second focus depth.

2. The method of claim 1, wherein receiving user input to select a two-dimensional position within the displayed image comprises:
   displaying an icon to select a position within the displayed image;
   receiving user input, via a pointing device, to move the displayed icon.

3. The method of claim 2, wherein the icon comprises a pointer.

4. The method of claim 2, wherein the icon comprises a brush tool to specify a region surrounding the selected position to refocus.

5. The method of claim 1, wherein identifying a stored refocused image in the plurality having the second focus depth comprises:
   identifying at least two of the refocused images having different focus depths; and
   blending the at least two identified images.

6. The method of claim 1, wherein receiving user input to select a two-dimensional position within the displayed image comprises:
   detecting contact with a touch-sensitive screen, the contact specifying a position within the displayed image.

7. The method of claim 1, wherein receiving user input to select a two-dimensional position within the displayed image comprises:
   detecting a user interaction gesture specifying a position within the displayed image.

8. The method of claim 1, further comprising:
   displaying a smooth transition from the display of the image having the first focus depth to the display of at least one refocused image having an intermediate focus depth between the first focus depth and the second focus depth; and
   displaying a smooth transition from the display of the at least one refocused image having an intermediate focus depth to the display of the refocused image having the second focus depth.

9. The method of claim 1, wherein:
   displaying the image having the first focus depth comprises:
      retrieving a first stored image having the first focus depth; and
      displaying the retrieved first image; and
   displaying the refocused image having the second focus depth comprises:
      retrieving a second stored image having the second focus depth; and
      displaying the retrieved second image.

10. The method of claim 1, wherein:
   displaying one of the refocused images comprises displaying a web page comprising the refocused image;
   receiving user input to select a two-dimensional position within the displayed image comprises receiving a signal indicating a user interaction with the web page; and
   displaying the refocused image having the second focus depth comprises displaying a web page comprising the refocused image having the second focus.

11. The method of claim 1, further comprising:
   receiving an indication of at least one tag, each tag being associated with a position in the image, each tag being further associated with a description;
   wherein:
   receiving user input to select a two-dimensional position within the displayed image comprises receiving user input to select a description; and
   displaying the refocused image having the second focus depth comprises refocusing the image to a focus depth corresponding to a position in the image associated with a tag associated with the selected description.

12. The method of claim 8, wherein displaying a smooth transition from the display of the image having the first focus depth to the display of at least one refocused image having an intermediate focus depth comprises:
   generating at least one intermediate image having a focus depth between the first focus depth and the second focus depth by determining an interpolated focus depth between the first focus depth and the second focus depth; and
   displaying the generated an image at the interpolated focus depth.

13. The method of claim 1, wherein digitally refocusing light field data to generate a plurality of refocused images comprises generating a plurality of projections of the light field image at different focus depths.

14. The method of claim 1, wherein determining which of the plurality of refocused images is in focus at the two-dimensional position comprises detecting edges at the two-dimensional position for each of the refocused images.

15. The method of claim 1, wherein determining which of the plurality of refocused images is in focus at the two-dimensional position comprises:
   for each of the refocused images, computing a gradient magnitude at the two-dimensional position, each refocused image having a focus depth; and
   comparing the computed gradient magnitudes at the two-dimensional position.

16. The method of claim 1, wherein:
storing an index entry associating the two-dimensional position with identified refocused image comprises storing, in a look-up table, an index entry associating the two-dimensional position with the focus depth of the identified refocused image; and
identifying a stored refocused image in the plurality associated with the selected two-dimensional position comprises:
- retrieving, from the look-up table, an index entry identifying a second focus depth corresponding to the selected two-dimensional position; and
- identifying a stored refocused image in the plurality having the second focus depth.

* * * * *